United States Patent
Chen et al.

(10) Patent No.: US 12,062,629 B2
(45) Date of Patent: Aug. 13, 2024

(54) MULTIBAND QAM INTERFACE FOR SLAB WAVEGUIDE

(71) Applicants: Taiwan Semiconductor Manufacturing Company Limited, Hsinchu (TW); The University of California, Los Angeles (UCLA), Los Angeles, CA (US)

(72) Inventors: Huan-Neng Chen, Taichung (TW); Chewn-Pu Jou, Hsinchu (TW); Feng Wei Kuo, Hsinchu (TW); Lan-Chou Cho, Hsinchu (TW); Wen-Shiang Liao, Miaoli (TW); Yanghyo Kim, Los Angeles, CA (US)

(73) Assignees: Taiwan Semiconductor Manufacturing Company Limited, Hsinchu (TW); The University of California, Los Angeles (UCLA), Los Angeles, CA (US)

( * ) Notice: Subject to any disclaimer, the term of this patent is extended or adjusted under 35 U.S.C. 154(b) by 0 days.

(21) Appl. No.: 15/691,941

(22) Filed: Aug. 31, 2017

(65) Prior Publication Data

US 2017/0365563 A1 Dec. 21, 2017

Related U.S. Application Data

(63) Continuation-in-part of application No. 15/258,348, filed on Sep. 7, 2016, now Pat. No. 10,162,198, which (Continued)

(51) Int. Cl.
*H01L 23/66* (2006.01)
*G02B 6/10* (2006.01)
(Continued)

(52) U.S. Cl.
CPC .............. *H01L 23/66* (2013.01); *G02B 6/102* (2013.01); *G02B 6/4274* (2013.01); *G02B 6/43* (2013.01); *G02F 1/011* (2013.01); *G02F 1/0121* (2013.01); *G02F 1/025* (2013.01); *H01L 23/552* (2013.01); *H01P 3/081* (2013.01); *H01P 3/16* (2013.01); *H04B 10/40* (2013.01)

(58) Field of Classification Search
None
See application file for complete search history.

(56) References Cited

U.S. PATENT DOCUMENTS 6,243,517 B1 * 6/2001 Deacon ................ G02B 6/1228
372/102
7,062,117 B2 * 6/2006 Uchida ................ H05K 1/0274
385/131

(Continued)

*Primary Examiner* — Chris H Chu
(74) *Attorney, Agent, or Firm* — Jones Day

(57) ABSTRACT

Systems and methods are provided for an integrated chip. An integrated chip includes a package substrate including a plurality of first layers and a plurality of second layers, each second layer being disposed between a respective adjacent pair of the first layers. A transceiver unit is disposed above the package substrate. A waveguide unit including a plurality of waveguides having top and bottom walls formed in the first layers of the package substrate and sidewalls formed in the second layers of the package substrate.

20 Claims, 30 Drawing Sheets

Related U.S. Application Data is a continuation-in-part of application No. 14/692,794, filed on Apr. 22, 2015, now Pat. No. 10,126,512, which is a continuation-in-part of application No. 14/483,247, filed on Sep. 11, 2014, now Pat. No. 9,372,316.

(60) Provisional application No. 62/451,258, filed on Jan. 27, 2017.

(51) Int. Cl.
- *G02B 6/42* (2006.01)
- *G02B 6/43* (2006.01)
- *G02F 1/01* (2006.01)
- *G02F 1/025* (2006.01)
- *H01L 23/552* (2006.01)
- *H01P 3/08* (2006.01)
- *H01P 3/16* (2006.01)
- *H04B 10/40* (2013.01)

(56) References Cited

U.S. PATENT DOCUMENTS

| | | | | |
|---|---|---|---|---|
| 7,136,551 | B2* | 11/2006 | Cho | G02B 6/06 385/31 |
| 7,639,912 | B2* | 12/2009 | Wang | G02B 6/12002 385/14 |
| 7,680,367 | B2* | 3/2010 | Matsuoka | G02B 6/43 385/14 |
| 8,358,892 | B2* | 1/2013 | Oda | G02B 6/4214 385/115 |
| 2001/0024559 | A1* | 9/2001 | Kling | G02B 6/105 385/132 |
| 2002/0136481 | A1* | 9/2002 | Mule' | G02B 6/132 385/14 |
| 2003/0179979 | A1* | 9/2003 | Ouchi | G02B 6/132 385/14 |
| 2005/0047716 | A1* | 3/2005 | Arakida | G02B 6/4214 385/31 |
| 2006/0062512 | A1* | 3/2006 | Lee | G02B 6/43 385/88 |
| 2009/0016671 | A1* | 1/2009 | Asai | G02B 6/43 174/262 |
| 2009/0020499 | A1* | 1/2009 | Nottola | G02B 6/42 216/2 |
| 2009/0028193 | A1* | 1/2009 | Islam | G01J 3/0245 372/6 |
| 2010/0046901 | A1* | 2/2010 | Stoeferle | G02B 6/1225 385/129 |
| 2010/0142881 | A1* | 6/2010 | Vernooy | G02B 6/138 385/14 |
| 2010/0215313 | A1* | 8/2010 | Matsuoka | G02B 6/43 385/14 |
| 2011/0018657 | A1* | 1/2011 | Cheng | H01P 3/121 333/239 |
| 2014/0044389 | A1* | 2/2014 | Uemura | G02B 6/4245 438/27 |
| 2014/0321803 | A1* | 10/2014 | Thacker | G02B 6/4274 385/14 |
| 2015/0145086 | A1* | 5/2015 | Rokuhara | G02B 6/4245 257/432 |
| 2015/0370015 | A1* | 12/2015 | Aoki | G02B 6/423 385/14 |

* cited by examiner

MULTIBAND QAM INTERFACE FOR SLAB WAVEGUIDE

REFERENCE TO RELATED APPLICATION

This application claims priority to U.S. Provisional Patent Application No. 62/451,258, filed Jan. 27, 2017, and is a continuation-in-part (CIP) of U.S. patent application Ser. No. 15/258,348, filed on Sep. 7, 2016, which is a CIP of U.S. patent application Ser. No. 14/692,794, filed on Apr. 22, 2015, which is a CIP of U.S. patent application Ser. No. 14/483,247, filed Sep. 11, 2014, now U.S. Pat. No. 9,372,316, each incorporated herein by reference in its entirety.

BACKGROUND

Integrated optical waveguides are often used as components in integrated optical circuits, which integrate multiple photonic functions. Integrated optical waveguides are used to confine and guide light from a first point on an integrated chip (IC) to a second point on the IC with minimal attenuation. Generally, integrated optical waveguides provide functionality for signals imposed on optical wavelengths in the visible spectrum (e.g., between approximately 850 nm and approximately 1650 nm).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
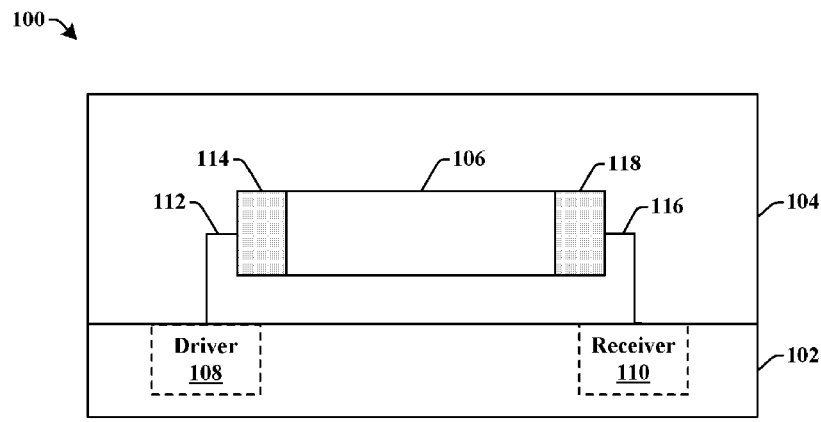
FIGS. 1A-1B illustrate some embodiments of an integrated chip comprising an integrated dielectric waveguide.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated optical waveguides are often used in integrated optical circuits. Generally, an integrated optical waveguide consist of an optical medium having a high dielectric constant (i.e., a core), which is surrounded by a medium having a lower dielectric constant. Visible light that is injected into an end of the integrated optical waveguide (e.g., using a lens, a grating coupler or prism coupler) is guided along a length of the waveguide by way of total internal reflection due to the difference in dielectric constants between the core and the surrounding medium.

Because integrated optical waveguides are limited to transmitting electromagnetic radiation in the visible section of the electromagnetic spectrum (e.g., having a frequency on the order of approximately $10^{15}$), they face a number of drawbacks. For example, integrated optical waveguides are not able to directly interact with circuitry disposed within a silicon substrate since silicon is not a direct band-gap semiconductor material that generates photons. Furthermore, the bandwidth that can be transmitted by integrated optical waveguides is limited. Because of these drawbacks, data is often transferred on silicon substrates using metal transmission lines rather than integrated optical waveguides. However, at high frequencies metal transmission lines experience a high rate of loss over large distances.

Accordingly, the present disclosure relates to an integrated chip comprising coupling elements configured to couple electromagnetic radiation having a frequency outside of the visible spectrum from a silicon substrate into an integrated dielectric waveguide overlying the silicon substrate. In some embodiments, the integrated chip comprises a dielectric waveguide disposed within an inter-level dielectric (ILD) material overlying a semiconductor substrate. A first coupling element is configured to couple a first electrical signal generated by a driver circuit disposed within the semiconductor substrate to a first end of the dielectric waveguide as electromagnetic radiation having a frequency outside of the visible spectrum. A second coupling element is configured to couple the electromagnetic radiation from a second end of the dielectric waveguide to a second electrical signal. By coupling electromagnetic radiation having a frequency outside of the visible spectrum to and from the dielectric waveguide, the disclosed integrated chip is able to overcome a number of drawbacks of optical integrated waveguides.

FIG. 1A illustrates some embodiments of a block diagram showing a cross-sectional view of an integrated chip 100 comprising an integrated dielectric waveguide.

The integrated chip 100 comprises a semiconductor substrate 102. In various embodiments, the semiconductor substrate 102 may comprise any type of semiconductor body such as a semiconductor wafer or one or more die on a wafer, as well as any other type of semiconductor and/or epitaxial layers formed thereon and/or otherwise associated therewith. In some embodiments, the semiconductor substrate 102 may comprise an indirect band-gap material, such as silicon.

An inter-level dielectric (ILD) material 104 is disposed over the semiconductor substrate 102. In various embodiments, the ILD material 104 may comprise one or more dielectric layers. For example, the ILD material 104 may comprise one or more of a low-k dielectric layer, an ultra-low k (ULK) dielectric layer, and/or a silicon dioxide ($SiO_2$) layer. A dielectric waveguide 106 is disposed within the ILD material 104. The dielectric waveguide 106 comprises a dielectric material having a dielectric constant (i.e., permittivity) that is larger than that of the surrounding ILD material 104.

A driver circuit 108 and a receiver circuit 110 are disposed within the semiconductor substrate 102. The driver circuit 108 is coupled to a first coupling element 114 by way of a first interconnect 112 (e.g., transmission line). The driver circuit 108 is configured to generate a first electrical signal, which is coupled into the dielectric waveguide 106 as electromagnetic radiation by way of a first coupling element 114. In some embodiments, the first coupling element 114 may comprise a metal coupling element (e.g., a metal transmission line or micro-strip line). In some embodiments, the electromagnetic radiation will have a frequency that is outside of the visible spectrum.

The dielectric waveguide 106 is configured to convey the electromagnetic radiation along a length of the dielectric waveguide 106 to a second coupling element 118. The second coupling element 118 is configured to couple the electromagnetic radiation from the dielectric waveguide 106 as a second electrical signal that is provided to the receiver circuit 110 by way of a second interconnect 116 (e.g., transmission line). In some embodiments, the second coupling element 118 may comprise a metal coupling element (e.g., a metal transmission line or micro-strip line). By using the first and second coupling elements, 114 and 118, to couple signals into and out of the dielectric waveguide 106, integrated chip 100 is able to transmit electromagnetic radiation over a broad range of frequencies, thereby enabling the dielectric waveguide 106 to be used to transfer data signals over substrates comprising direct and indirect band-gap materials.

Figure 1B:
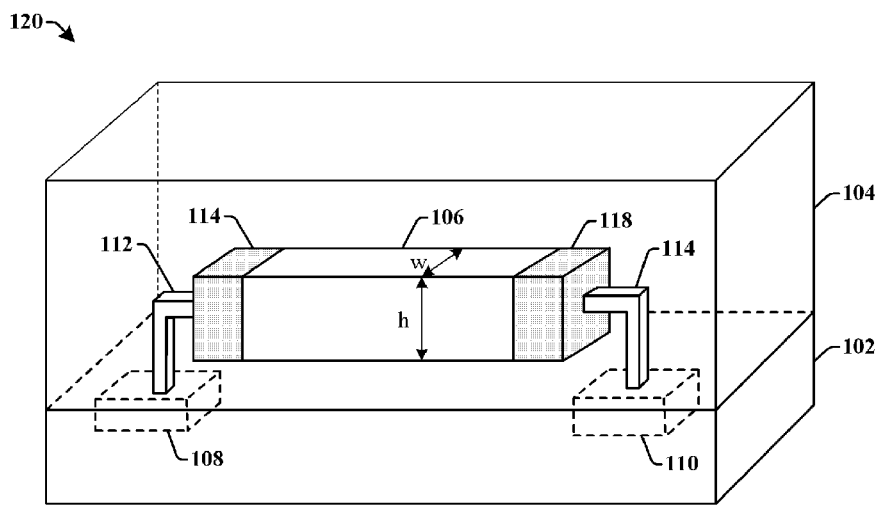

FIG. 1B illustrates some embodiments of a three-dimensional view 120 of an integrated chip comprising an integrated dielectric waveguide.

As shown in three-dimensional view 120, the dielectric waveguide 106 comprises a slab waveguide disposed over the semiconductor substrate 102. In some embodiments, the dielectric waveguide 106 may have a substantially rectangular cross section comprising a height h and a width w. In some embodiments, the height h may be in a range of between approximately 100 nm and approximately 2 um. In some embodiments, the width w may be in range of between approximately 5 to approximately 15 times the height h. In some embodiments, the dielectric waveguide 106 may have sloped sidewalls, which give the dielectric waveguide 106 an inverted trapezoidal cross-section (having a width that increases as the height increases).

In some embodiments, the dielectric waveguide 106 may comprise a dielectric constant (i.e., permittivity) of greater than or equal to approximately 4, while the ILD material 104 may have a dielectric constant of less than 4. The greater dielectric constant of the dielectric waveguide 106 causes electromagnetic radiation introduced into the dielectric waveguide 106 to be confined within the dielectric waveguide 106 by total internal reflection, so that the electromagnetic radiation is guided from the driver circuit 108 to the receiver circuit 110. In some embodiments, the dielectric waveguide 106 may comprise silicon nitride (SiN) or silicon carbide (SiC). In some embodiments, the ILD material 104 may comprise silicon dioxide ($SiO_2$). In other embodiments, the ILD material 104 may comprise a low-k dielectric material, such as fluorine-doped silicon dioxide, carbon-doped silicon dioxide, porous silicon dioxide, or a similar material.

Figure 2:
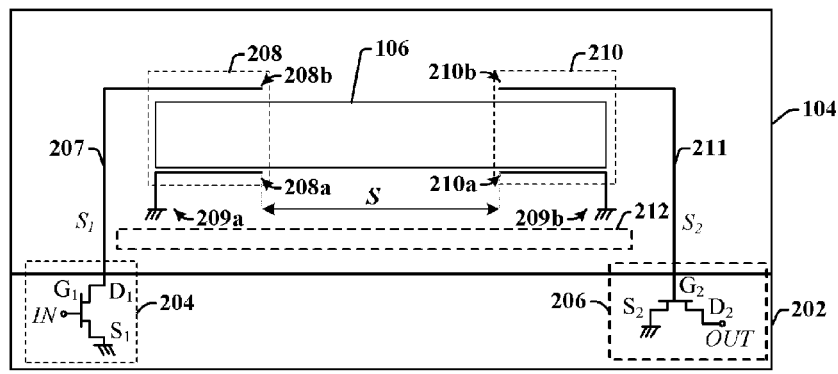
FIG. 2 illustrates some embodiments of a cross-sectional view of an integrated chip comprising an integrated dielectric waveguide.

FIG. 2 illustrates some embodiments of a cross-sectional view of an integrated chip 200 comprising an integrated dielectric waveguide.

The integrated chip 200 comprises a silicon substrate 202 comprising a driver circuit 204 and a receiver circuit 206. The driver circuit 204 comprises a first MOS transistor having a first source region ($S_1$), a first drain region ($D_1$), and a first gate region ($G_1$) coupled to an input signal IN. The receiver circuit 206 comprises a second MOS transistor having a second source region ($S_2$), a second drain region ($D_2$), and a second gate region ($G_2$) coupled to the second coupling element 210.

During operation, the driver circuit 204 is configured to generate a first electrical signal $S_1$ at the first drain region ($D_1$) based upon the input signal IN. Since silicon is not a direct band-gap material, the first electrical signal $S_1$ generated by the driver circuit 204 has a frequency that is not in the visible spectrum (since silicon is an indirect band-gap material, the energy released during electron recombination with a hole is converted primarily into phonons, in contrast to direct band-gap materials that generate photons in the optical spectrum). The first electrical signal $S_1$ causes the first upper electrode 208b to generate an electric field that extends outward from the first upper electrode 208b, through the dielectric waveguide 106, to the first lower electrode 208a. The electric field causes electromagnetic radiation corresponding to the first electrical signal $S_1$ to be coupled into the dielectric waveguide 106.

The coupled electromagnetic radiation is guided by the dielectric waveguide 106 to the second coupling element 210. The second coupling element 210 is configured to couple the electromagnetic radiation from the dielectric waveguide 106 to second electrical signal $S_2$, equivalent to the first electrical signal $S_1$, which is provided to the second gate region ($G_2$) of the receiver circuit 206.

While the first and second electrical signals, $S_1$ and $S_2$, may have a frequency that is lower than that of the visible spectrum, they can provide for a large data transfer rate due to the wide bandwidth of electromagnetic radiation that can be transmitted by the dielectric waveguide 106. For example, the dielectric waveguide 106 may provide for a bandwidth that is more than ten times larger than that of the visible spectrum, resulting in data transfer rates of that can exceed 10 gigabits/s. Such data transfer rates can provide for ultra-high-speed (UHS) interconnect on silicon substrates and/or on packages containing silicon substrates at high frequencies that experience high loss for transmission lines.

In some embodiments, the first coupling element 208 may comprise a first pair of metal structures (e.g., a micro-strips) disposed on opposing sides of the dielectric waveguide 106. For example, the first coupling element 208 may comprise a first lower electrode 208a (e.g., within a first metal interconnect layer) disposed along a bottom surface of the dielectric waveguide 106 and a first upper electrode 208b (e.g., within a second metal interconnect layer) disposed along a top surface of the dielectric waveguide 106. The first lower electrode 208a is connected to a first ground terminal 209a, while the first upper electrode 208b is connected to the driver circuit 204 by way of a first metal transmission line 207. The first metal transmission line 207 provides for a wide bandwidth transmission of signals from the driver circuit 204 to the first upper electrode 208b. In some embodiments, the first upper electrode 208b may be comprised within the first metal transmission line 207.

The second coupling element 210 may comprise a second pair of metal structures disposed on opposing sides of the dielectric waveguide 106. For example, the second coupling element 210 may comprise a second lower electrode 210a (e.g., within the first metal interconnect layer) disposed along the bottom surface of the dielectric waveguide 106 and a second upper electrode 210b (e.g., within the second metal interconnect layer) disposed along the top surface of the dielectric waveguide 106. The second lower electrode 210a is connected to a second ground terminal 209b, while the second upper electrode 210b is connected to the receiver circuit 206 by way of a second metal transmission line 211. The first pair of metal structures is laterally separated from the second pair of metal structures by a space S, so that the lower electrodes, 208a and 210a, and the upper electrodes, 208b and 210b, are non-continuous along a length of the dielectric waveguide 106. In some embodiments, the space S may be on the order of microns to tens of millimeters.

In some embodiments, a grounded shielding element 212 is vertically positioned between the dielectric waveguide 106 and the silicon substrate 202. The grounded shielding element 212 is configured to shield the dielectric waveguide 106 from interference due to signals generated within the silicon substrate 202, and vice versa. By shielding the dielectric waveguide 106 from interference due to signals generated within the silicon substrate 202, noise from the silicon substrate 202 will not be coupled into the dielectric waveguide 106, thereby improving performance of the dielectric waveguide 106.

Figure 3:
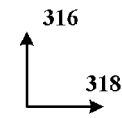
FIG. 3 illustrates some embodiments of a top-view of an integrated chip comprising an integrated dielectric waveguide having one or more tapered transitional regions.

FIG. 3 illustrates some embodiments of a top-view of an integrated chip 300 comprising an integrated dielectric waveguide having one or more tapered transitional regions, 312 and/or 314.

Integrated chip 300 comprises a first coupling element 302 and a second coupling element 304, respectively comprising micro-strip lines, 306 and 308, disposed over a dielectric waveguide 310. The micro-strip lines, 306 and 308, are configured to couple energy into and out of the dielectric waveguide 310, as described above.

In some embodiments, the dielectric waveguide 310 may comprise one or more tapered ends having widths w (along direction 316) that gradually decrease (e.g., from a first width to a second narrower width) over a length (along direction 318) of a transition region. For example, dielectric waveguide 310 comprises a first tapered end, having a width that decreases over a first transition region 312, and a second tapered end having a width that decreases over a second transition region 314.

The tapered ends of the dielectric waveguide 106 are configured to increase efficiency by which electromagnetic radiation is coupled between the micro-strip lines, 306 and/or 308, and the dielectric waveguide 310 by reducing the reflection of radiation between the micro-strip lines, 306 and/or 308, and the dielectric waveguide 310. For example, the tapered transitional region changes the angle at which electromagnetic radiation interacts with sidewalls of the dielectric waveguide 106, thereby increase the coupling of electromagnetic radiation between the micro-strip lines, 306 and/or 308, and the dielectric waveguide 310 (since total internal reflection is a function of an angle at which electromagnetic radiation is incident upon a surface).

In some embodiments, the micro-strip lines, 306 and 308, can also or alternatively have tapered widths, to further increase coupling efficiency between the first and second coupling elements, 302 and 304, and the dielectric waveguide 310. In such embodiments, the micro-strip lines, 306 and 308, have widths that decrease (e.g., from a first width to a second narrower width) over the transition regions, 312 and 314. In some embodiments, the tapered widths of the micro-strip lines, 306 and 308, may be different in length (i.e., have different sized transitional regions) than the tapered widths of a dielectric waveguide 106.

Figure 4:
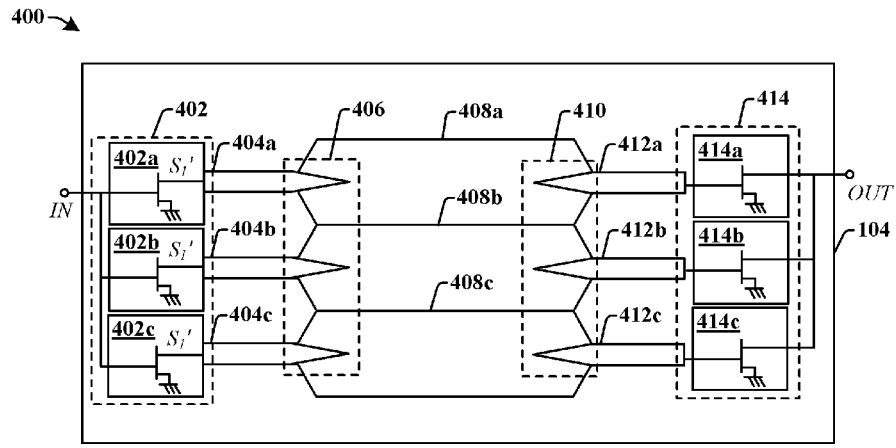
FIG. 4 illustrates some embodiments of a top-view of an integrated chip comprising a plurality of integrated dielectric waveguides configured to convey electromagnetic radiation in parallel.

FIG. 4 illustrates some embodiments of a top-view of an integrated chip 400 comprising a plurality of an integrated dielectric waveguides configured to convey electromagnetic radiation in parallel.

Integrated chip 400 comprises a plurality of dielectric waveguides 408a-408c disposed between a driver circuit 402 and a receiver circuit 414. In some embodiments, the plurality of dielectric waveguides 408a-408c may be physically arranged in parallel to one another. In some embodiments, the plurality of dielectric waveguides 408a-408c may abut one another. In other embodiments, the plurality of dielectric waveguides 408a-408c may be spatially separated from one another.

The driver circuit 402 comprises a plurality of separate driver elements, 402a-402c, which are configured to respectively generate a first electrical signal $S_1'$. The first electrical signal $S_1'$ is provided in parallel to micro-strip lines 404a-404c, which couple the first electrical signal $S_1'$ as electromagnetic radiation into the plurality of dielectric waveguides 408a-408c, which convey the signal in parallel. Since the first electrical signal $S_1'$ is transmitted in parallel, smaller amplitude signals can be conveyed by each of the plurality of dielectric waveguides 408a-408c, thereby further decreasing loss between the micro-strips 404a-404c and the plurality of dielectric waveguides 408a-408c (e.g., the smaller amplitude signals $S_1'$ output by the plurality of driver elements, 402a-402c, and received by the plurality of receiver elements 414a-414c will cause coupling elements 406 and 410 to experience less loss).

Figure 5A:
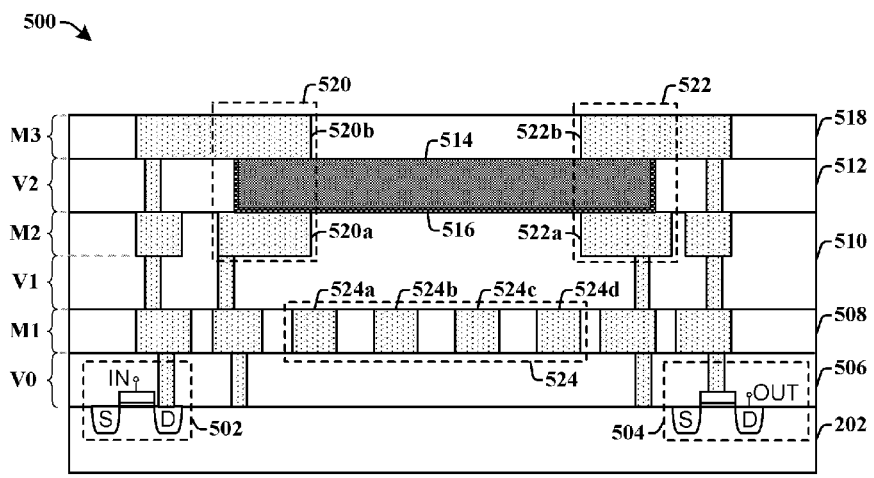
FIGS. 5A-5B illustrates some embodiments of integrated chips comprising an integrated dielectric waveguide disposed within a back-end-of-the-line (BEOL) metallization stack.

FIG. 5A illustrates some embodiments of a cross-sectional view of an integrated chip 500 comprising an integrated dielectric waveguide disposed within a back-end-of-the-line (BEOL) metallization stack.

The integrated chip 500 comprises a driver circuit 502 and a receiver circuit 504 disposed within a silicon substrate 202. The driver circuit 502 comprises a first MOS transistor having a first source region (S) separated from a first drain region (D) by a first channel region. A first gate region overlies the first channel region. The receiver circuit 504 comprises a second MOS transistor having a second source region (S) separated from a second drain region (D) by a second channel region. A second gate region overlies the second channel region.

The BEOL metallization stack comprises a plurality of metal interconnect layers disposed within an ILD material overlying the silicon substrate 202. In some embodiments, the BEOL metallization stack may alternate between metal wire layers M1-M3 (configured to provide for lateral connections) and via layers V0-V2 (configured to provide for vertical connections). In some embodiments, a first via layer V0 may comprise tungsten (W), while the remaining metal interconnect layers, V1-V2 and M1-M3, may comprise copper (Cu) and/or aluminum (Al)

A first coupling element 520 comprises a first lower electrode 520a disposed within a second metal wire layer M2 and a first upper electrode 520b disposed within a third metal wire layer M3. The first lower electrode 520a is grounded, while the first upper electrode 520b is coupled to the first drain region of the first MOS transistor by way of a plurality of metal interconnect layers (V2, M2, V1, M1, and V0). The second coupling element 522 comprises a second lower electrode 522a disposed within the second metal wire layer M2 and a second upper electrode 522b disposed on the third metal wire layer M3. The second lower electrode 522a is grounded, while the second upper electrode 522b is coupled to the second gate region of the second MOS transistor by way of a plurality of metal interconnect layers (V2, M2, V1, M1, and V0). In some embodiments, the dielectric waveguide 514 comprises a dielectric material disposed within a second via layer V2 vertically disposed between the second metal wire layer M2 and the third metal wire layer M3

In some embodiments, a shielding element 524 is vertically arranged between the dielectric waveguide 514 and the silicon substrate 202. The shielding element 524 comprises a plurality of grounded metal wires 524a-524d arranged in parallel. In some embodiments, the plurality of grounded metal wires 524a-524d are disposed on a first metal wire layer M1. The shielding element 524 is configured to shield the dielectric waveguide 514 from the silicon substrate 202, which is lossy, thereby preventing loss in signals transmitted by the dielectric waveguide 514.

Although FIG. 5A illustrates the dielectric waveguide 514 as being on a second via layer V1 vertically disposed between first and second coupling elements, 520 and 522, located on the second and third metal wire layers, M2 and M3, it will be appreciated that the disclosed dielectric waveguide 514 is not limited to such positions within the BEOL metallization stack. Rather, the dielectric waveguide 514 and the first and second coupling elements, 520 and 522, may be disposed at different positions within the BEOL metallization stack.

Figure 5B:
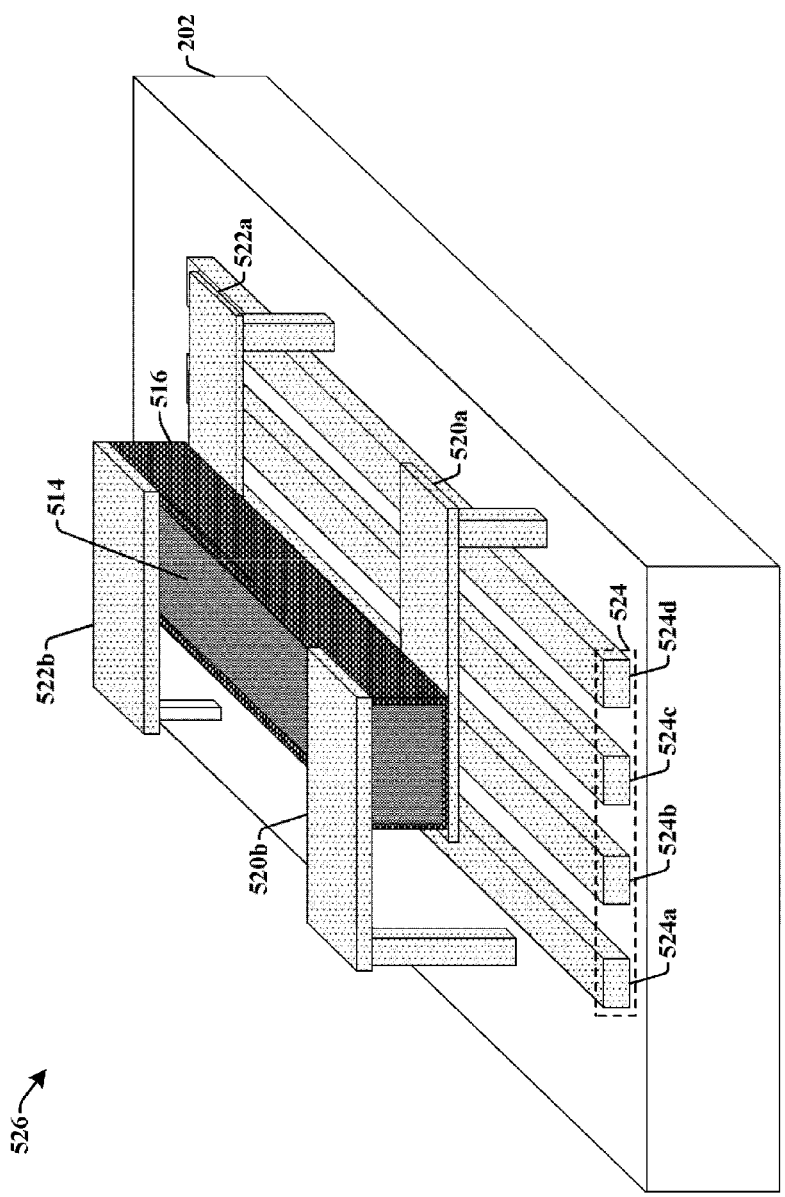

FIG. 5B illustrates a three-dimensional view of some alternative embodiments of an integrated chip 526 comprising an integrated dielectric waveguide disposed within a BEOL metallization stack. Integrated chip 526 comprises lower electrodes, 520a and 522a, and upper electrodes, 520b and 522b, which extend to positions below and above the dielectric waveguide 514 from opposite sides.

Figure 6:
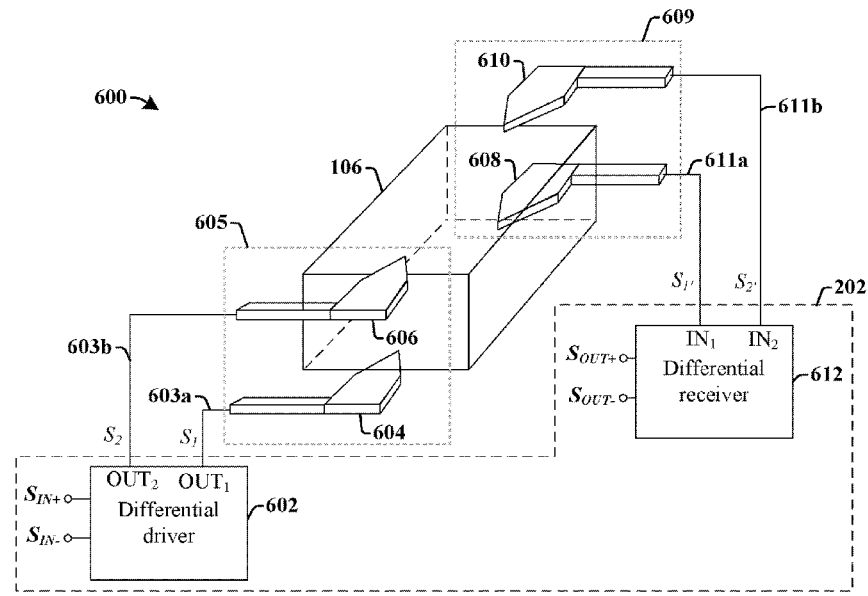
FIG. 6 illustrates some embodiments of an integrated chip comprising an integrated dielectric waveguide configured to convey a differential signal.

FIG. 6 illustrates some embodiments of a three-dimensional (3D) view of an integrated chip 600 having a dielectric waveguide configured to convey a differential signal. The use of a differential signal may provide for a number of performance advantages over single ended signals. For example, the differential signal is more robust against interference (e.g., from external circuits) and generate less even harmonics than a single ended signal.

The integrated chip 600 comprises a differential driver circuit 602 and a differential receiver circuit 612 disposed within a silicon substrate 202. The differential driver circuit 602 is configured to receive a first input signal $S_{IN+}$ and a complimentary second input signal $S_{IN-}$ (i.e., which is symmetric to the first input signal $S_{IN+}$), and based thereupon to generate differential signal having a first transmission signal component $S_1$ at a first output node $OUT_1$ and a complementary second transmission signal component $S_2$ (i.e., a second signal having a complementary value to the first transmission signal component $S_1$) at a second output node $OUT_2$.

The first transmission signal component $S_1$ and the complementary second transmission signal component $S_2$ are provided to a differential transmission coupling element 605 by way of transmission lines 603a and 603b. The differential transmission coupling element 605 comprises a first transmission electrode 604 and a second transmission electrode 606. The first transmission electrode 604 and the second transmission electrode 606 are conductive structures (e.g., metal structures) that are symmetric (i.e., the shapes/patterns of the electrodes mirror images) about a dielectric waveguide 106. The first transmission electrode 604 is located along a first side of the dielectric waveguide 106 and is configured to receive the first transmission signal component $S_1$ from the differential driver circuit 602. The second transmission electrode 606 is located along a second side of the dielectric waveguide 106 and is configured to receive the complementary second transmission signal component $S_2$ from the differential driver circuit 602.

The dielectric waveguide 106 is configured to transmit the first signal and second transmission signals, $S_1$ and $S_2$, to a differential receiver coupling element 609 comprising a first receiver electrode 608 and a second receiver electrode 610 located on opposite sides of the dielectric waveguide 106. The first receiver electrode 608 and the second receiver electrode 610 are symmetric (i.e., the shapes/patterns of the electrodes mirror images) about the dielectric waveguide 106. The first receiver electrode 608 and a second receiver electrode 610 are configured to extract a first received signal component $S_1'$ and a second received signal component $S_2'$ from the dielectric waveguide 106. The first received signal component $S_1'$ is provided to a first input node $IN_1$ of the differential receiver circuit 612 by way of a first transmission line 611a. The second received signal component $S_2'$ is provided to a second input node $IN_2$ of the differential receiver circuit 612 by way of a second transmission line 611b. The differential receiver circuit 612 is configured to generate output signals $S_{out+}$ and $S_{out-}$ from the received signal components, thereby conveying a differential signal over the dielectric waveguide 106.

Figure 7:
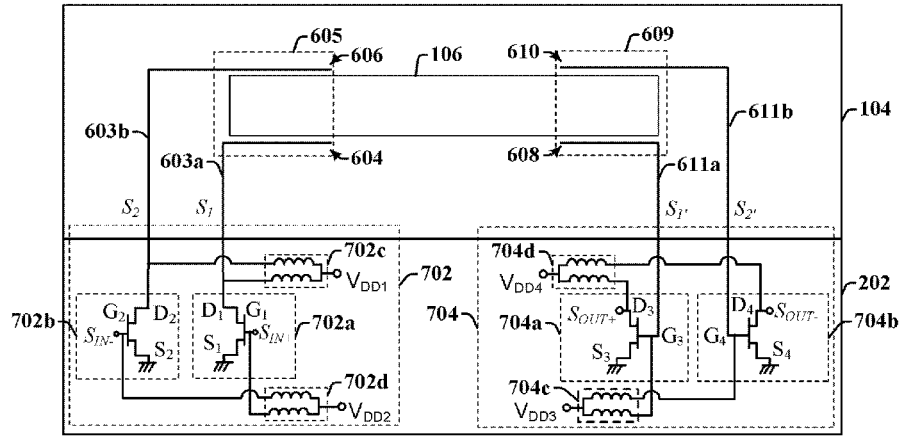
FIG. 7 illustrates some embodiments of an integrated chip comprising a differential driver circuit and a differential receiver circuit disposed within a silicon substrate.

FIG. 7 illustrates some embodiments of a cross-sectional view of an integrated chip 700 comprising a differential driver circuit 702 and a differential receiver circuit 704 disposed within a silicon substrate 202.

The differential driver circuit 702 is configured to generate a differential signal having a first transmission signal component $S_1$ and a complementary second transmission signal component $S_2$. In some embodiments, the differential driver circuit comprises a first MOS transistor 702a and a second MOS transistor 702b. The first MOS transistor 702a comprises a first source region ($S_1$) connected to a ground terminal, a first drain region ($D_1$) connected to a first output node and to a drain bias voltage $V_{DD1}$ (via RF chock 702c), and a first gate region ($G_1$) connected to a first input signal $S_{IN+}$ and to a gate bias voltage $V_{DD2}$ (via RF chock 702d). The second MOS transistor 702b comprises a second source region ($S_2$) connected to the ground terminal, a second drain region ($D_2$) connected to a second output node and to drain bias voltage $V_{DD1}$ (via RF chock 702c), and a second gate region ($G_2$) connected to a second input signal $S_{IN-}$ and to gate bias voltage $V_{DD2}$ (via RF chock 702d).

During operation, the first input signal $S_{IN+}$ will turn on the first MOS transistor 702a when the second input signal $S_{IN-}$ turns off the second MOS transistor 702b, or vice versa. When turned on, the first MOS transistor 702a will drive the first transmission signal component $S_1$ low, while the turned off second MOS transistor 702b will drive the complementary second transmission signal component $S_2$ high. Since silicon is not a direct band-gap material, the first and second transmission signal components, $S_1$ and $S_2$ generated by the differential driver circuit 702 have a frequency that is not in the visible spectrum (since silicon is an indirect band-gap material, the energy released during electron recombination with a hole is converted primarily into phonons, in contrast to direct band-gap materials that generate photons in the optical spectrum). The first and second transmission signal components, $S_1$ and $S_2$, cause differential transmission coupling element 605 to generate an electric field that is coupled into the dielectric waveguide 106.

The coupled electromagnetic radiation is guided by the dielectric waveguide 106 to differential receiver coupling element 609, which has a first receiver electrode 608 and a second receiver electrode 610. The differential receiver coupling element 609 is configured to couple the electromagnetic radiation from the dielectric waveguide 106 to first and second received signal components, $S_{1'}$ and $S_{2'}$, which are equivalent to the first and second transmission signal components, $S_1$ and $S_2$. The first and second received signal components, $S_{1'}$ and $S_{2'}$, are provided to a differential receiver circuit 704. In some embodiments, the differential receiver circuit 704 comprises a third MOS transistor 704a and a fourth MOS transistor 704b. The third MOS transistor 704a comprises a third source region ($S_3$) connected to a ground terminal, a third gate region ($G_3$) connected to the first receiver electrode 608 and to a gate bias voltage $V_{DD3}$ (via RF chock 704c), and a third drain region ($D_3$) connected to drain bias voltage $V_{DD4}$ (via RF chock 704d) and configured to provide a first output signal $S_{OUT+}$. The fourth MOS transistor 704b comprises a fourth source region ($S_4$) connected to a ground terminal, a fourth gate region ($G_4$) connected to the second receiver electrode 610 and to gate bias voltage $V_{DD3}$ (via RF chock 704c), and a fourth drain region ($D_4$) connected to drain bias voltage $V_{DD4}$ (via RF chock 704d) and configured to provide a second output signal $S_{OUT-}$.

Although MOS transistors 704a-704d are illustrated as single transistor devices, it will be appreciated that the MOS transistors may comprise an array of transistors comprising a plurality of transistor devices (e.g., FinFET devices) arranged in parallel. For example, first MOS transistor 702a may comprise hundreds or transistor devices. Furthermore, it will be appreciated that the differential driver circuit 702 and the differential receiver circuit 704 illustrated in FIG. 7 are non-limiting examples of differential circuits that may be used to send and/or receive differential signals. In other embodiments, alternative differential circuits for high speed CMOS applications, known to one of ordinary skill in the art, may be used to generate or receive a differential signal.

Figure 8:
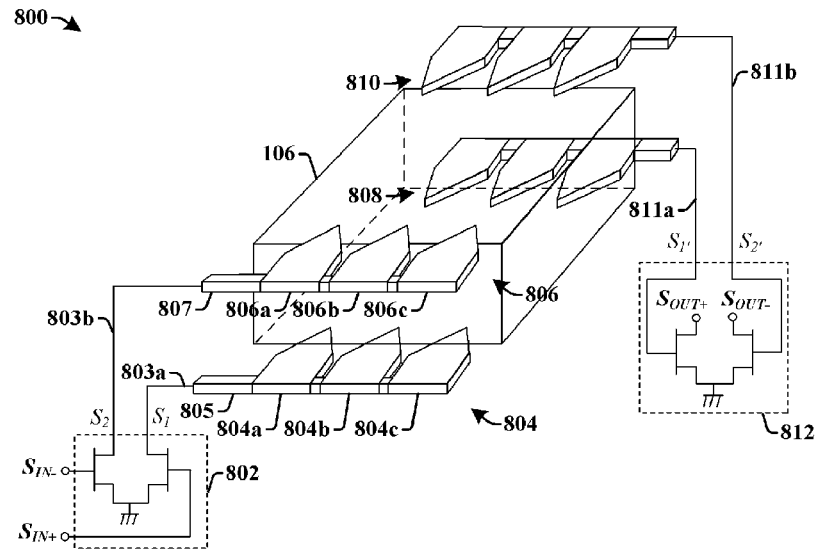
FIGS. 8-10 illustrate three-dimensional views of some additional embodiments of an integrated chip comprising an integrated dielectric waveguide coupled to differential coupling elements.

FIG. 8 illustrates a three-dimensional view of some embodiments of an integrated chip 800 comprising an integrated dielectric waveguide coupled to differential coupling elements.

The integrated chip 800 comprises a differential transmission coupling element comprising a first plurality of transmission electrodes 804 disposed along a lower surface of a dielectric waveguide 106 and a second plurality of transmission electrodes 806 disposed along an upper surface of the dielectric waveguide 106. The first plurality of transmission electrodes 804 comprise a plurality of tapered shapes 804a-804c interconnected by a conductive line 805. The second plurality of transmission electrodes 806 comprise a plurality of tapered shapes 806a-806c interconnected by conductive line 807. In some embodiments, the plurality of tapered shapes, 804a-804c and 806a-806c, may comprise triangular shapes. The first plurality of transmission electrodes 804 are symmetric with respect to the second plurality of transmission electrodes 806, such that the shapes/patterns of the first and second plurality of transmission electrodes, 804 and 806, are mirror images.

The first plurality of transmission electrodes 804 are coupled to a first output of a differential driver circuit 802 (via transmission line 803a) configured to provide a first transmission signal component $S_1$ to each of the first plurality of transmission electrodes 804. The second plurality of transmission electrodes 806 are coupled to a second output of the differential driver circuit 802 (via transmission line 803b) configured to provide a second transmission signal component $S_2$ to each of the second plurality of transmission electrodes 806. Since the first and second transmission signal components, $S_1$ and $S_2$, drive each of the transmission electrodes 804 and 806, the electromagnetic signals output from each of the electrodes will be coherent, thereby constructively interfering with one another within the dielectric waveguide 106 and improving the strength of the electromagnetic signal transmitted within the dielectric waveguide 106.

The integrated chip 800 further comprises a differential receiver coupling element comprising a first plurality of receiver electrodes 808 disposed along a lower upper surface of the dielectric waveguide 106 and a second plurality of receiver electrodes 810 disposed along an upper surface of the dielectric waveguide 106. The first and second plurality of receiver electrodes, 808 and 810, comprise a plurality of tapered shapes. The first plurality of receiver electrodes 808 are configured to provide a first received signal component $S_{1'}$ to a first input of a differential receiver circuit 812, and the second plurality of receiver electrodes 810 are configured to provide a second received signal component $S_{2'}$ to a second input of the differential receiver circuit 812.

Figure 9:
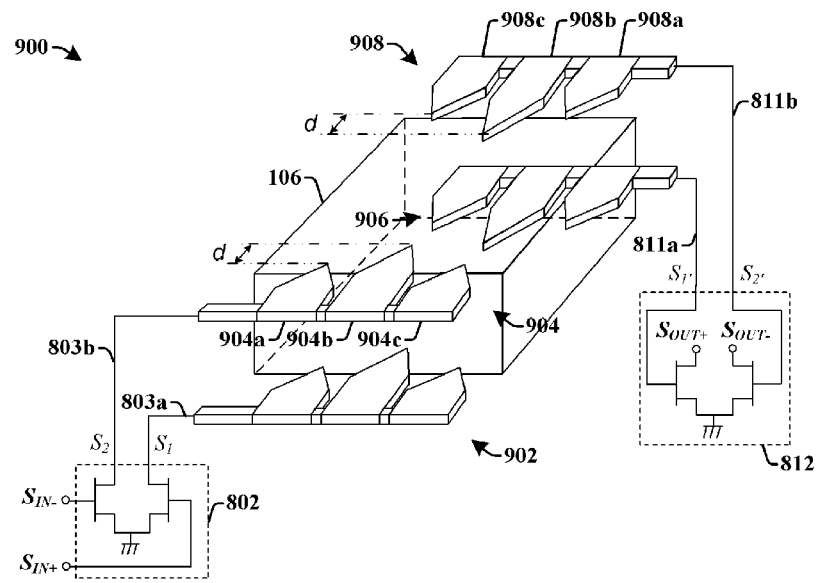

FIG. 9 illustrates a three-dimensional view of some embodiments of an integrated chip 900 comprising an integrated dielectric waveguide coupled to differential coupling elements.

The integrated chip 900 comprises a differential transmission coupling element comprises a first plurality of transmission electrodes 902 disposed along a lower surface of a dielectric waveguide 106 and a second plurality of transmission electrodes 904 disposed along an upper surface of the dielectric waveguide 106. The first and second plurality of transmission electrodes, 902 and 904, respectively comprise electrodes having different sizes. For example, transmission electrode 902b extends to a distance d past the edge of transmission electrodes 902a and 902c. The different sizes of the different transmission electrodes 904 allows for the electrodes to focus radiation at different locations within the dielectric waveguide 106. For example, the larger size of transmission electrode 902b will cause radiation to be focused into a center of the dielectric waveguide 106 (i.e., radiation within the dielectric waveguide 106 will have an amplitude that is greater at the center of the waveguide than at the edges of the waveguide).

The integrated chip 900 further a differential receiver coupling element comprises a first plurality of receiver electrodes 906 disposed along a lower surface of the dielectric waveguide 106 and a second plurality of receiver electrodes 908 disposed along an upper surface of the dielectric waveguide 106. The first and second plurality of receiver electrodes, 906 and 908, respectively comprise electrodes having different sizes.

Figure 10:
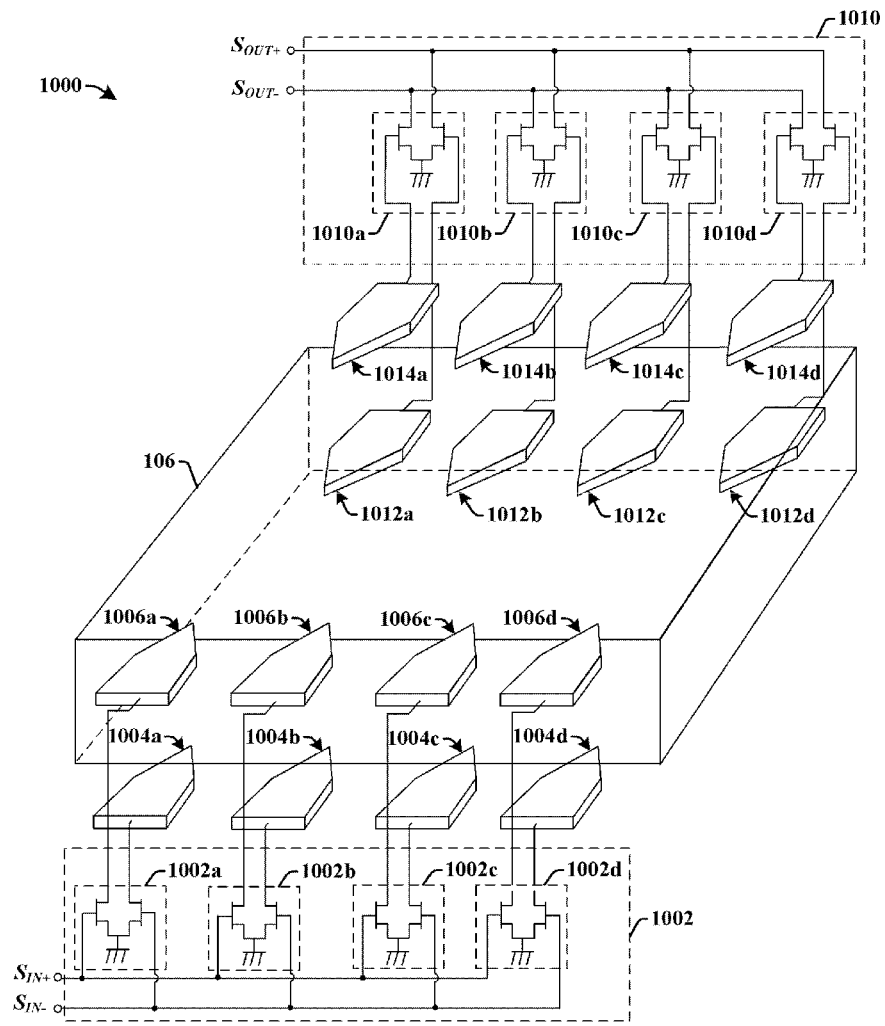

FIG. 10 illustrates a three-dimensional view of some embodiments of an integrated chip comprising an integrated dielectric waveguide coupled to differential coupling elements.

Integrated chip 1000 comprises a differential driver circuit 1002 and a differential receiver circuit 1010. The differential driver circuit 1002 is connected to a first plurality of transmission electrodes 1004 disposed below a dielectric waveguide 106 and a second plurality of transmission electrodes 1006 disposed above the dielectric waveguide 106. The first plurality of transmission electrodes 1004 are electrically de-coupled, and the second plurality of transmission electrodes 1006 are electrically decoupled.

The differential driver circuit 1002 comprises a plurality of separate differential driver circuits 1002a-1002d. In some embodiments, each of the plurality of separate differential driver circuits 1002a-1002d may comprise a separate array of transistor devices arranged in parallel. The separate differential driver circuits 1002a-1002d are configured to drive one of the first plurality of transmission electrodes 1004 and one of the second plurality of transmission electrodes 1006, such that each of the first or second plurality of transmission electrodes, 1004 and 1006, is driven by a separate driver circuit. For example, in some embodiments, the separate differential driver circuits 1002a-1002d respectively comprise a first transistor having a first gate coupled to a first input signal $S_{IN+}$ and a first drain coupled to one of the first plurality of transmission electrodes 1004, and a second transistor device having a second gate coupled to a second input signal $S_{IN-}$ and a second drain coupled to one of the second plurality of transmission electrodes 1006.

Similarly, the differential receiver circuit 1010 comprises a plurality of separate differential receiver circuits 1010a-1010d. The separate differential receiver circuits 1010a-1010d are configured to receive differential receiver signals from one of a first plurality of receiver electrodes 1012 and one of a second plurality of receiver electrodes 1014. For example, in some embodiments, the separate differential receiver circuits 1010a-1010d respectively comprise a first transistor device having a first gate coupled to one of the first plurality of receiver electrodes 1012 and a first drain coupled to a first output signal $S_{OUT+}$, and a second transistor device having a second gate coupled to one of the second plurality of transmission electrodes 1006 and a second drain coupled to a second output signal $S_{OUT-}$.

Figure 11:
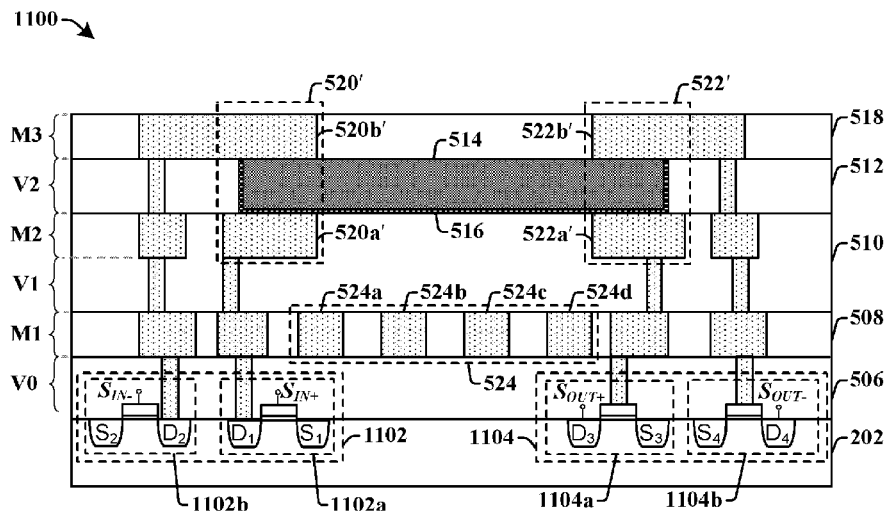
FIG. 11 illustrates some embodiments of an integrated chip comprising a dielectric waveguide having differential coupling elements disposed within a BEOL metallization stack.

FIG. 11 illustrates a three-dimensional view of some embodiments of an integrated chip 1100 comprising a dielectric waveguide having differential coupling elements disposed within a BEOL metallization stack.

The integrated chip 1100 comprises a differential driver circuit 1102 and a differential receiver circuit 1104 disposed within a silicon substrate 202. The differential driver circuit 1102 comprises a first MOS transistor 1102a having a first source region ($S_1$) separated from a first drain region ($D_1$) by a first channel region. A first gate region ($G_1$) overlies the first channel region. The differential driver circuit 1102 further comprises a second MOS transistor 1102b having a second source region ($S_2$) separated from a second drain region ($D_2$) by a second channel region. A second gate region ($G_2$) overlies the second channel region. The differential receiver circuit 1104 comprises a third MOS transistor 1104a having a third source region ($S_3$) separated from a third drain region ($D_3$) by a third channel region. A third gate region ($G_3$) overlies the third channel region. The differential receiver circuit 1104 further comprises a fourth MOS transistor 1104b having a fourth source region ($S_4$) separated from a fourth drain region ($D_4$) by a fourth channel region. A fourth gate region ($G_4$) overlies the fourth channel region.

A differential transmission coupling element 520' comprises a first transmission electrode 520a' disposed within a second metal wire layer M2 and a second transmission electrode 520b' disposed within a third metal wire layer M3. The first transmission electrode 520a' is coupled to the first drain region ($D_1$) of the first MOS transistor 1102a by way of a plurality of metal interconnect layers (V2, M2, V1, M1, and V0), while the first upper electrode 520b' is coupled to the second drain region ($D_2$) of the second MOS transistor 1102b by way of a plurality of metal interconnect layers (V2, M2, V1, M1, and V0).

A differential receiver coupling element 522' comprises a first receiver electrode 522a' disposed within the second metal wire layer M2 and a second receiver electrode 522b' disposed on the third metal wire layer M3. The first receiver electrode 522a' is coupled to the third gate region ($G_3$) of the third MOS transistor 1104a by way of a plurality of metal interconnect layers (V2, M2, V1, M1, and V0), while the second receiver electrode 522b' is coupled to the fourth gate region ($G_4$) of the fourth MOS transistor by way of a plurality of metal interconnect layers (V2, M2, V1, M1, and V0).

Figure 12:
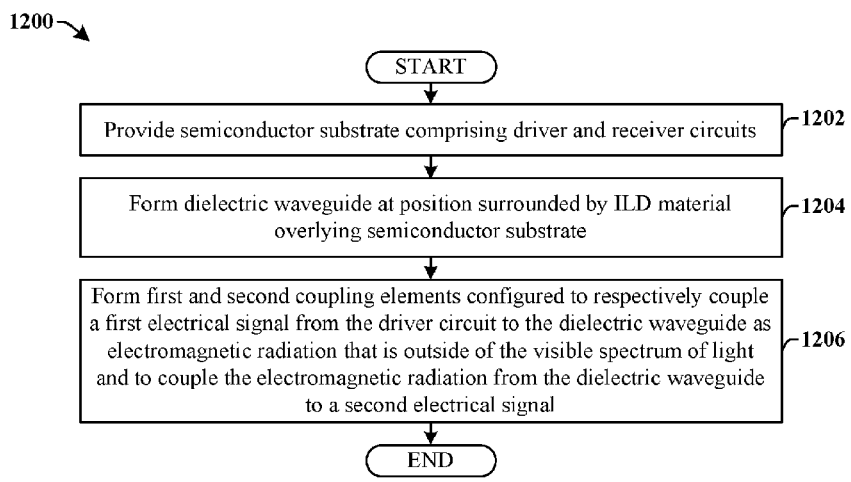
FIG. 12 illustrates a flow diagram of some embodiments of a method of forming an integrated chip comprising an integrated dielectric waveguide.

FIG. 12 illustrates a flow diagram of some embodiments of a method 1200 of forming an integrated chip comprising an integrated dielectric waveguide.

While disclosed methods (e.g., methods 1200, 1300, and 2000) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1202, a semiconductor substrate is provided comprising a driver circuit and a receiver circuit. In some embodiments, the semiconductor substrate may comprise an indirect band-gap semiconductor material, such as silicon.

At 1204, a dielectric waveguide is formed at a position surrounded by an (inter-level dielectric) ILD material overlying the semiconductor substrate.

At 1206, first and second coupling elements are formed on opposing ends of the dielectric waveguide. The first and second coupling elements comprise metal structures disposed on opposing sides of the dielectric waveguide, which are configured to respectively couple a first electrical signal from the driver circuit to the dielectric waveguide as electromagnetic radiation that is outside of the visible spectrum of light and to couple electromagnetic radiation from the dielectric waveguide to a second electrical signal that is provided to the receiver circuit.

Figure 13:
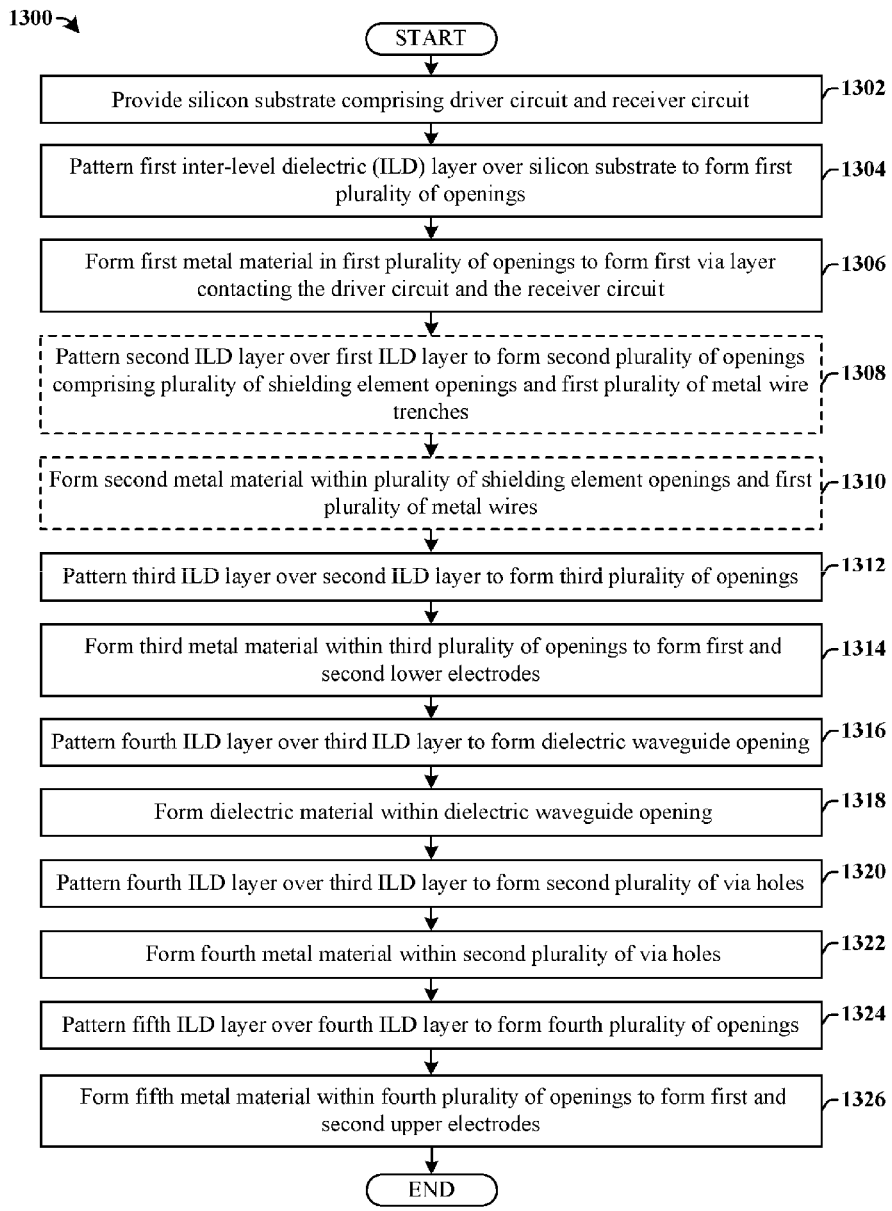
FIG. 13 illustrates a flow diagram of some embodiments of a method of forming an integrated chip comprising an integrated dielectric waveguide disposed within a BEOL metallization stack.

FIG. 13 illustrates a flow diagram of some embodiments of a method 1300 of forming an integrated chip comprising an integrated dielectric waveguide disposed within a back-end-of-the line (BEOL) metallization stack.

At 1302, a silicon substrate comprising a driver circuit and a receiver circuit is provided. In some embodiments, the driver circuit and the receiver circuit comprise MOS transistors disposed within the silicon substrate.

At 1304, a first (inter-level dielectric) ILD layer overlying the silicon substrate is patterned to form a first plurality of openings.

At 1306, a first metal material is formed within the first plurality of openings to form a first via layer contacting the driver and receiver circuits.

At 1308, a second ILD layer overlying the first ILD layer is patterned to form a second plurality of openings comprising a plurality of shielding element openings and a first plurality of metal wire trenches.

At 1310, a second metal material is formed within the plurality of shielding element openings and the first plurality of metal wire trenches. Forming the second metal material within the plurality of shielding element openings forms a shielding element comprising a plurality of grounded metal wires within the second ILD layer, which are arranged in parallel.

At 1312, a third ILD layer overlying the second ILD layer is patterned to form a third plurality of openings. The third plurality of openings comprise a first lower electrode opening and a second lower electrode opening. The first and second lower electrode openings are laterally separated from one another.

At 1314, a third metal material is formed within the first and second lower electrode openings to form first and second lower electrodes within the third ILD layer.

At 1316, a fourth ILD layer overlying the third ILD layer is patterned to form a dielectric waveguide opening. The dielectric waveguide opening has a first end that exposes the first lower electrode and a second end that exposes the second lower electrode.

At 1318, a dielectric material is formed within the dielectric waveguide opening to form a dielectric waveguide within the fourth ILD layer. The dielectric material has a greater dielectric constant than that of surrounding ILD layers.

At 1320, the fourth ILD layer is patterned to form a second plurality of via holes within the fourth ILD layer.

At 1322, a fourth metal material is formed within the second plurality of via holes.

At 1324, a fifth ILD layer overlying the fourth ILD layer is patterned to form a first upper electrode opening and a second upper electrode opening. The first upper electrode opening and the second upper electrode opening are laterally separated from one another, and expose opposing ends of the dielectric waveguide.

At 1326, a fifth metal material is formed within the first and second upper electrode openings to form first and second upper electrodes within the fifth ILD layer.

FIGS. 14-19 illustrate some embodiments of cross-sectional views showing a method of forming an integrated chip comprising an integrated dielectric waveguide. Although FIGS. 14-19 are described in relation to method 1300, it will be appreciated that the structures disclosed in FIGS. 14-19 are not limited to such a method, but instead may stand alone as structures independent of the method.

Figure 14:
FIGS. 14-19 illustrate some embodiments of cross-sectional views showing a method of forming an integrated chip comprising an integrated dielectric waveguide.

FIG. 14 illustrates some embodiments of a cross-sectional view 1400 of an integrated chip corresponding to act 1302.

As shown in cross-sectional view 1400, a silicon substrate 202 is provided. The silicon substrate 202 comprises a driver circuit 502 and a receiver circuit 504. In some embodiments, the driver circuit 502 and the receiver circuit 504 comprise MOS transistors disposed within the silicon substrate 202.

Figure 15:
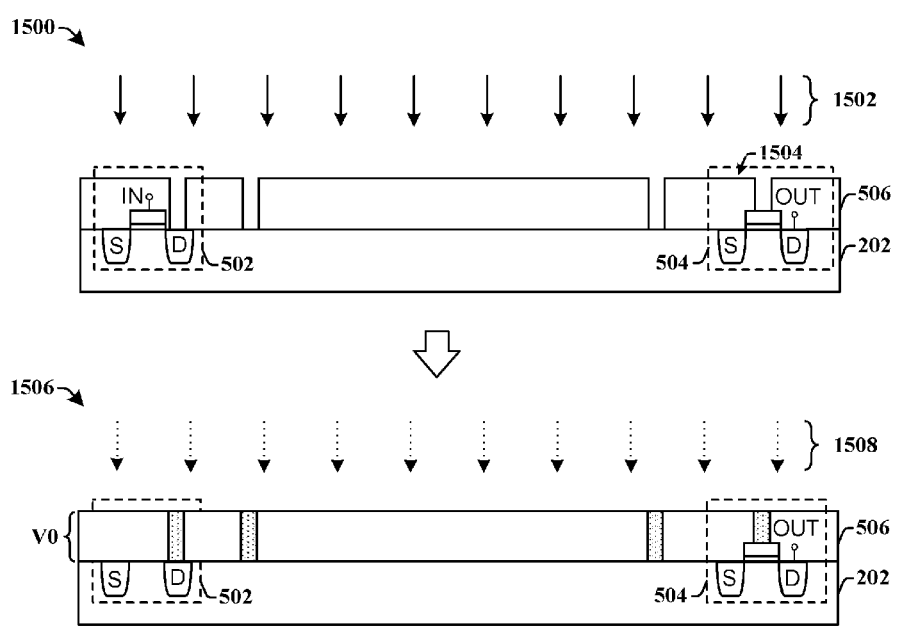

FIG. 15 illustrates cross-sectional views, 1500 and 1506, of an integrated chip corresponding to acts 1304-1306.

As shown in cross-sectional view 1500, a first ILD layer 506 is formed over the silicon substrate 202. The first ILD layer 506 may comprise a low-k dielectric layer deposited by way of a vapor deposition technique (e.g., physical vapor deposition, chemical vapor deposition, etc.). In some embodiments, the first ILD layer 506 may have a dielectric constant that is less than 3.9.

The first ILD layer 506 is selectively exposed to a first etchant 1502. The first etchant 1502 is configured to selectively etch the first ILD layer 506 to form a first plurality of openings 1504 extending through the first ILD layer 506. The first plurality of openings 1504 expose a drain of the driver circuit 502 and the receiver circuit 504. In some embodiments, the first etchant 1502 may comprise a dry etchant have an etching chemistry comprising a fluorine species (e.g., $CF_4$, $CHF_3$, $C_4F_8$, etc.). In some embodiments, the etching chemistry may further comprise oxygen or hydrogen, for example. In other embodiments, the first etchant 1502 may comprise a wet etchant comprising hydroflouric acid (HF).

As shown in cross-sectional view 1506, a first metal material 1508 is formed within the first plurality of openings 1504. In some embodiments, the first metal material 1508 may be formed by way of a vapor deposition technique. In some embodiments, the first metal material 1508 may comprise tungsten (W). In some embodiments, a diffusion barrier layer (not shown) may be deposited into the first plurality of openings 1504 prior to forming the first metal material 1508. In various embodiments, the diffusion barrier layer may comprise titanium nitride (TiN), tantalum nitride (TaN), hafnium nitride (HfN), etc.

Figure 16:
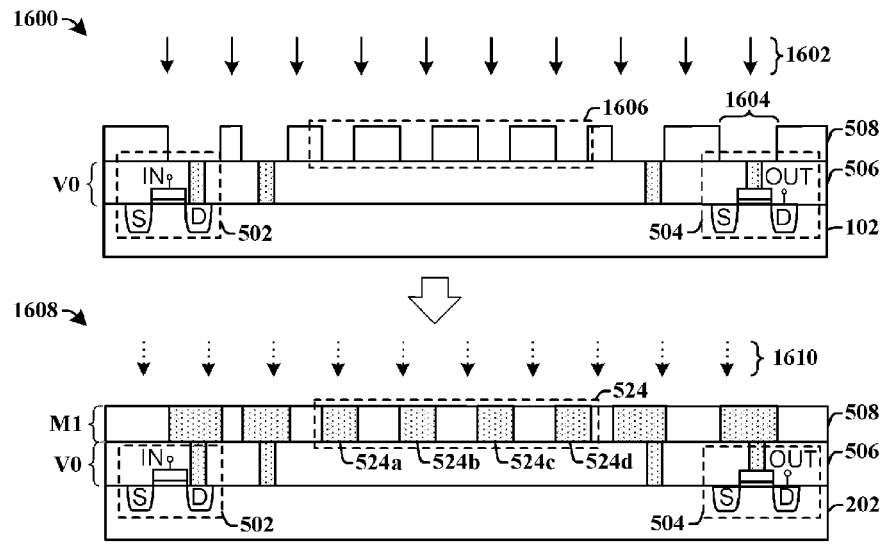

FIG. 16 illustrates cross-sectional views, 1600 and 1608, of an integrated chip corresponding to acts 1308-1310.

As shown in cross-sectional view 1600, a second ILD layer 508 (e.g., a low-k dielectric layer) is formed over the first ILD layer 506 (e.g., by way of a vapor deposition technique). The second ILD layer 508 is selectively exposed to a second etchant 1602 (e.g., $CF_4$, $CHF_3$, $C_4F_8$, HF, etc.) configured to selectively etch the second ILD layer 508 to form a second plurality of openings comprising a first plurality of via openings 1604 and a plurality of shielding element openings 1606 laterally disposed from the plurality of via openings 1604. The plurality of shielding element openings 1606 comprise metal trenches extending in parallel to one another.

As shown in cross-sectional view 1608, a second metal material 1610 is formed in the first plurality of via openings 1604 and the plurality of shielding element openings 1606. In some embodiments, a deposition process may be used to form a seed layer within the first plurality of via openings 1604 and the plurality of shielding element openings 1606. A subsequent plating process (e.g., an electroplating process, an electro-less plating process) may be used to form the second metal material to a thickness that fills the first plurality of via openings 1604 and the plurality of shielding element openings 1606. In some embodiments, the second metal material 1610 may comprise copper (Cu). A chemical mechanical polishing (CMP) process may be used to remove excess of the second metal material 1610 from a top surface of the second ILD layer 508.

Figure 17:
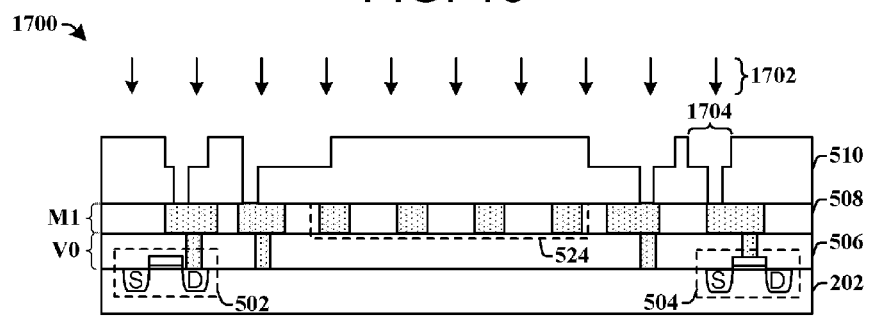

FIG. 17 illustrates cross-sectional views, 1700 and 1702, of an integrated chip corresponding to acts 1312-1314.

As shown in cross-sectional view 1700, a third ILD layer 510 is formed onto the second ILD layer 508. The third ILD layer 510 is selectively exposed to a third etchant 1702 (e.g., $CF_4$, $CHF_3$, $C_4F_8$, HF, etc.) configured to etch the third ILD layer 510 to from a third plurality of openings 1704. In some embodiments, the third plurality of openings 1704 comprise a via hole, and an overlying metal wire trench. The via holes vertically extending from a bottom surface of the third ILD layer 510 to a bottom surface of the metal trenches, which extend to a top surface of the third ILD layer 510.

As shown in cross-sectional view 1706, a third metal material 1708 is formed in the third plurality of openings 1704 to form a second via layer V1 and an overlying second metal wire layer M2. The second metal wire layer M2 comprises a first lower electrode 520a and a second lower electrode 522a. The first lower electrode 520a is laterally separated from the second lower electrode 522a by way of the third ILD layer 510. In some embodiments, the third metal material 1708 (e.g., copper) may be deposited by way of a deposition process, a subsequent plating process, and a CMP process, as described above.

Although FIG. 17 illustrates the formation of the second via layer V1 and second metal wire layer M2 using a dual damascene process, one of ordinary skill in the art will appreciate that the in alternative embodiments, the second via layer V1 and the second metal wire layer M2 may be formed using a single damascene process. In such embodiments, a first dielectric layer is selectively etched to form via holes, which are subsequently filled. A second dielectric layer is then formed over the first dielectric layer. The second dielectric layer is selectively etched to form metal trenches.

Figure 18:
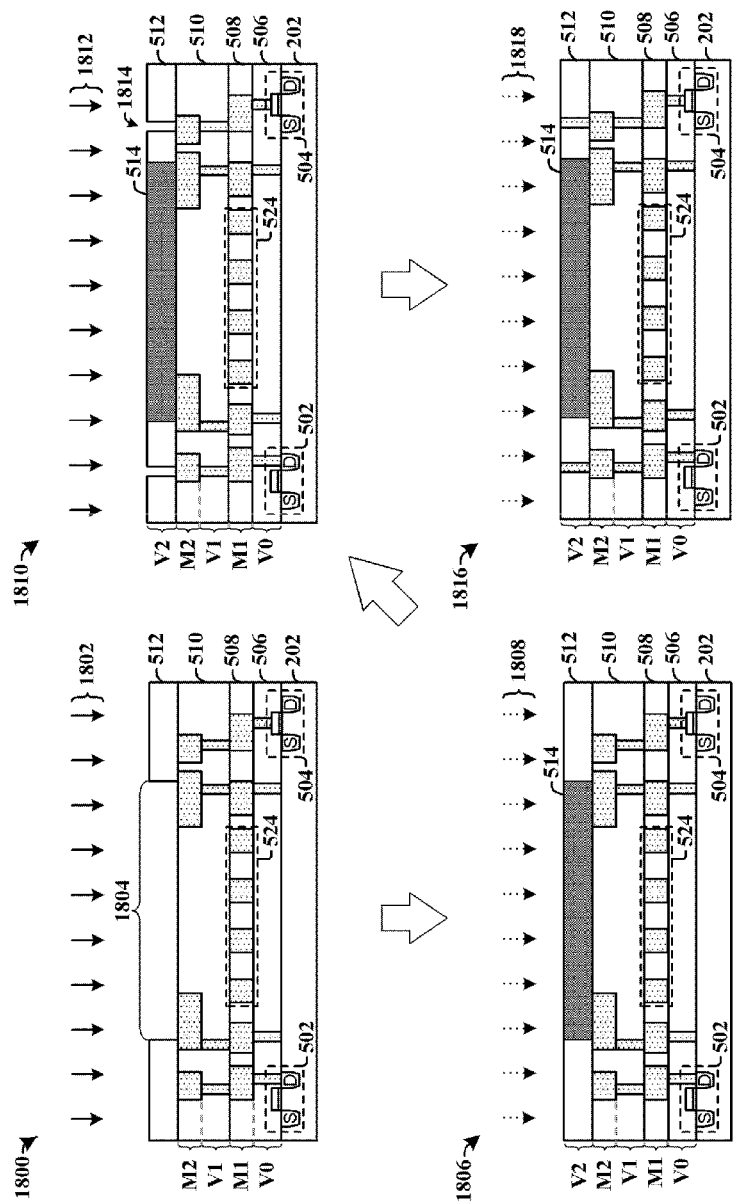

FIG. 18 illustrates some embodiments of cross-sectional views, 1800 and 1802, of an integrated chip corresponding to acts 1316-1322.

As shown in cross-sectional view 1800, a fourth ILD layer 512 is formed over the third ILD layer 510. The fourth ILD layer 512 is selectively exposed to a fourth etchant 1802 (e.g., $CF_4$, $CHF_3$, $C_4F_8$, HF, etc.) configured to etch the fourth ILD layer 512 to form a dielectric waveguide opening 1804. The dielectric waveguide opening 1804 comprises an oblong opening that laterally extends from a first position overlying the first lower electrode 520a to a second position overlying the second lower electrode 522a.

As shown in cross-sectional view 1806, a dielectric material 1808 is formed within the dielectric waveguide opening 1804. The dielectric material 1808 comprises a higher dielectric constant than the surrounding ILD layers (e.g., ILD layer 510 and 512). In some embodiments, the dielectric material 1808 may be formed by way of a vapor deposition technique (e.g., PVD, CVD, PE-CVD, etc.) to a thickness that fills the dielectric waveguide opening 1804. A chemical mechanical polishing (CMP) process may be used to remove excess of the dielectric material 1808 from a top surface of the fourth ILD layer 512.

As shown in cross-sectional view 1810, the fourth ILD layer 512 is selectively exposed to a fifth etchant 1812 (e.g., $CF_4$, $CHF_3$, $C_4F_8$, HF, etc.) configured to etch the fourth ILD layer 512 to from a second plurality of via holes 514. The second plurality of via holes 1814 comprise substantially round via openings disposed over an underlying metal layer (i.e., the via holes 1814 are predominately over the underlying second metal layer M2 so as to provide for contact between a subsequently formed via and the underlying second metal layer M2). The second plurality of via holes 1814 are laterally separated from the dielectric waveguide opening 1804 (i.e., the dielectric waveguide opening 1804 is disposed on a same vertical level as the second plurality of via holes 1814).

As shown in cross-sectional view 1816, a fourth metal material 1818 is formed within the second plurality of via holes 1814. In some embodiments, the fourth metal material 1818 (e.g., copper) may be deposited by way of a deposition process, a subsequent plating process, and a CMP process, as described above.

Figure 19:
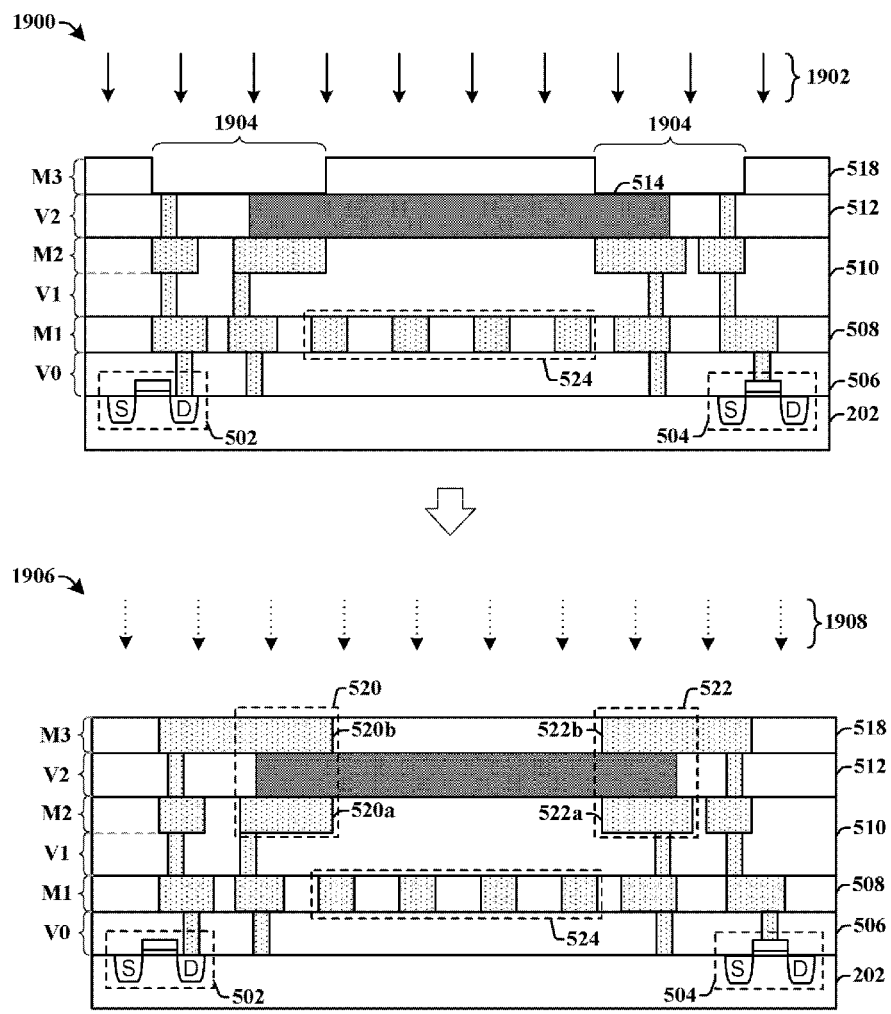

FIG. 19 illustrates some embodiments of cross-sectional views, 1900 and 1906, of an integrated chip corresponding to acts 1324-1326.

As shown in cross-sectional view 1900, a fifth ILD layer 518 is formed over the fourth ILD layer 512. The fifth ILD layer 518 is selectively exposed to a sixth etchant 1902 (e.g., $CF_4$, $CHF_3$, $C_4F_8$, HF, etc.) configured to etch the fifth ILD layer 518 to from a fourth plurality of openings 1904 comprising metal trenches that extend through the fifth ILD layer 518.

As shown in cross-sectional view 1906, a fifth metal material 1908 is formed in the fourth plurality of openings 1904. In some embodiments, the fifth metal material 1908 (e.g., copper) may be deposited by way of a deposition process, a subsequent plating process, and a CMP process, as described above. The fifth metal material 1908 forms a first upper electrode 520b and a second upper electrode 522b within a third metal wire layer M3. The first upper electrode 520b is laterally separated from the second upper electrode 522b by way of the fifth ILD layer 518.

Figure 20:
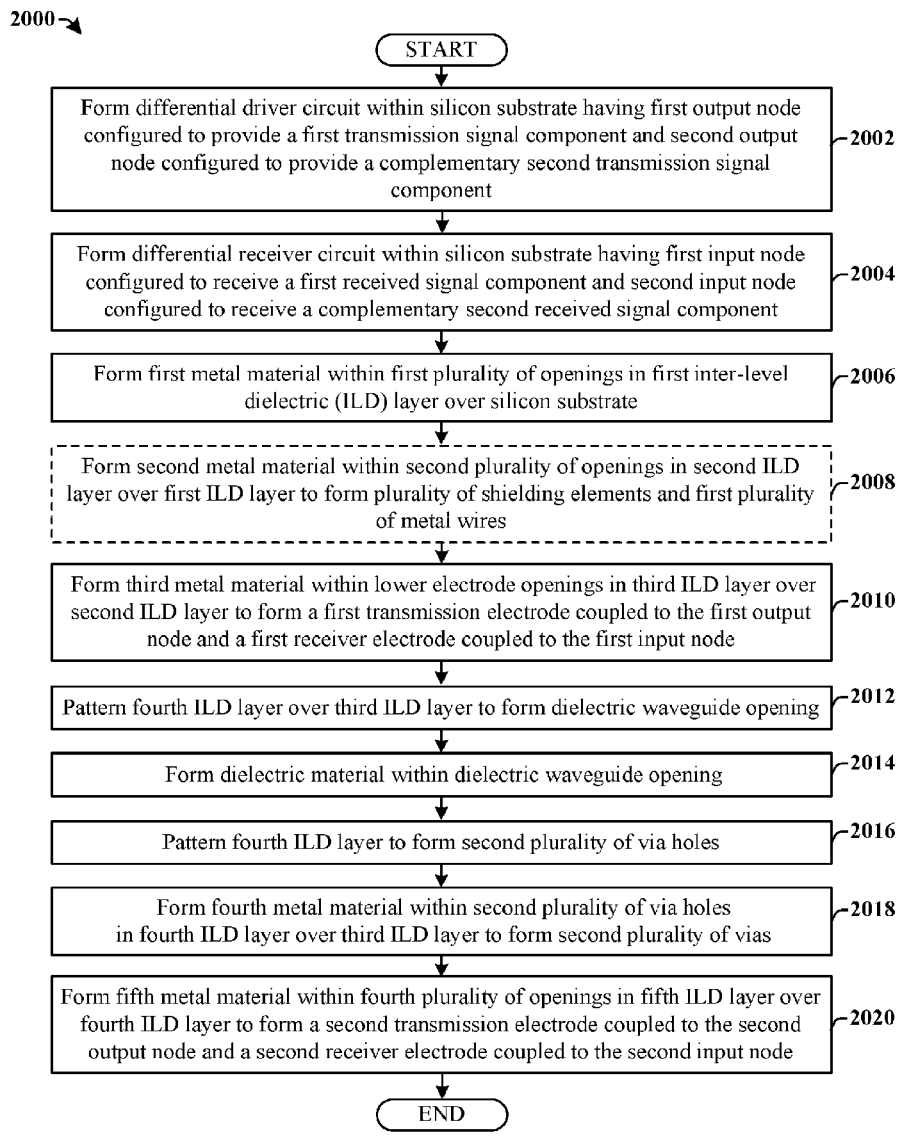
FIG. 20 illustrates a flow diagram of some embodiments of a method of forming an integrated chip comprising a dielectric waveguide coupled to differential coupling elements.

FIG. 20 illustrates a flow diagram of some embodiments of a method 2000 of forming an integrated chip comprising a dielectric waveguide coupled to differential coupling elements.

At 2002, a differential driver circuit is formed within a silicon substrate. The differential driver circuit has a first output node configured to provide a first transmission signal component and a second output node configured to provide a complementary second transmission signal component. In some embodiments, the differential driver circuit comprises MOS transistors disposed within the silicon substrate.

At 2004, a differential receiver circuit is formed within the silicon substrate. The differential receiver circuit has a first input node configured to receive a first received signal component and a second input node configured to receive a complementary second received signal component. In some embodiments, the differential receiver circuit comprises MOS transistors disposed within the silicon substrate.

At 2006, a first metal material is formed within a first plurality of openings in a first ILD layer to form a first via layer contacting the first and second output nodes of the differential driver circuit and the first and second inputs nodes of the differential receiver circuit.

At 2008, a second metal material is formed within a second plurality of shielding element openings and a first plurality of metal wire trenches formed within a second ILD layer overlying the first ILD layer. Forming the second metal material within the plurality of shielding element openings forms a shielding element comprising a plurality of grounded metal wires within the second ILD layer, which are arranged in parallel.

At 2010, a third metal material is formed within a lower electrode openings within a third ILD layer to form a first transmission electrode coupled to the first output node and a first receiver electrode coupled to the first input node.

At 2012, a fourth ILD layer overlying the third ILD layer is patterned to form a dielectric waveguide opening. The dielectric waveguide opening has a first end that exposes the first transmission electrode and a second end that exposes the first receiver electrode.

At 2014, a dielectric material is formed within the dielectric waveguide opening to form a dielectric waveguide within the fourth ILD layer. The dielectric material has a greater dielectric constant than that of surrounding ILD layers.

At 2016, the fourth ILD layer is patterned to form a second plurality of via holes within the fourth ILD layer.

At 2018, a fourth metal material is formed within the second plurality of via holes.

At 2020, a fifth metal material is formed within upper electrode openings within a fifth ILD layer overlying the fourth ILD layer to form a second transmission electrode coupled to the second output node and a second receiver electrode coupled to the second input node. The second transmission electrode and the second receiver electrode are laterally separated from one another.

FIGS. 21-26 illustrate some embodiments of cross-sectional views showing a method of forming an integrated chip comprising an integrated dielectric waveguide coupled to differential coupling elements. Although FIGS. 21-26 are described in relation to method 2000, it will be appreciated that the structures disclosed in FIGS. 21-26 are not limited to such a method, but instead may stand alone as structures independent of the method.

Figure 21:
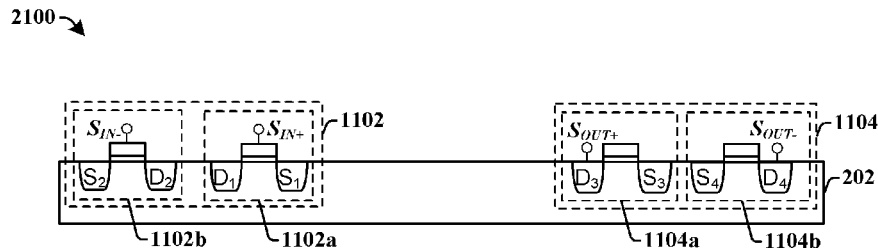
FIGS. 21-26 illustrate some embodiments of cross-sectional views showing a method of forming an integrated chip comprising a dielectric waveguide coupled to differential coupling elements.

FIG. 21 illustrates some embodiments of a cross-sectional view 2100 of an integrated chip corresponding to acts 2002-2004

As shown in cross-sectional view 2100, a silicon substrate 202 is provided. A differential driver circuit 1102 and a differential receiver circuit 1104 are formed within the silicon substrate 202. In some embodiments, the differential driver circuit 1102 may comprise first and second MOS transistors, 1102a and 1102b, and the differential receiver circuit 1104 may comprise first and second MOS transistors, 1104a and 1104b. In some embodiments, the MOS transistors may be formed by selectively implanting a dopant species into the silicon substrate 202 to form source and drain regions, and using lithography techniques to form gate structures over channel regions between the source and drain regions.

Figure 22:
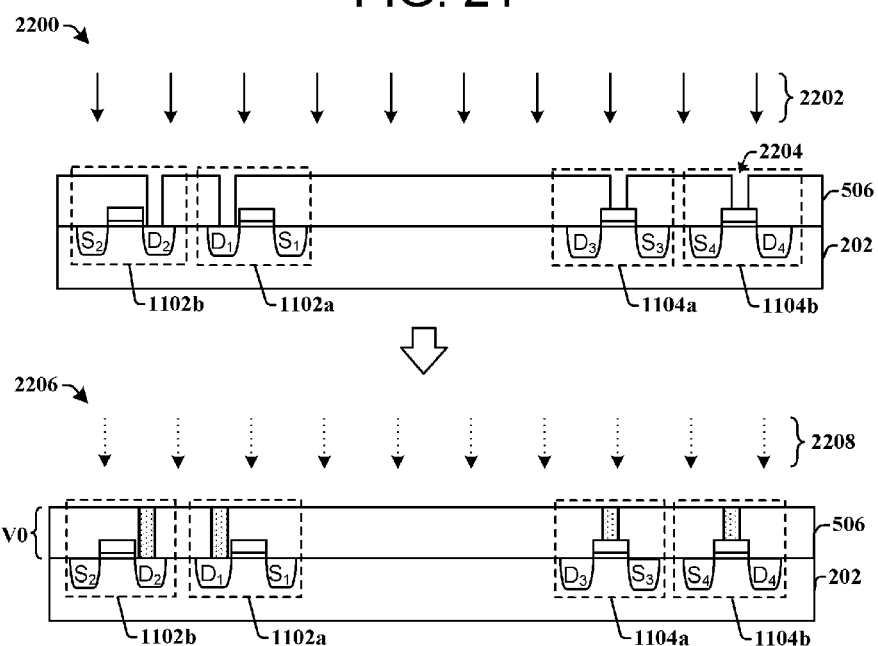

FIG. 22 illustrates cross-sectional views, 2200 and 2206, of an integrated chip corresponding to act 2006.

As shown in cross-sectional view 2200, a first ILD layer 506 is formed over the silicon substrate 202. The first ILD layer 506 may comprise a low-k dielectric layer deposited by way of a vapor deposition technique (e.g., physical vapor deposition, chemical vapor deposition, etc.). The first ILD layer 506 is selectively exposed to a first etchant 2202. The first etchant 2202 is configured to selectively etch the first ILD layer 506 to form a first plurality of openings 2204 extending through the first ILD layer 506. The first plurality of openings 2204 expose a drain of the driver circuit 502 and the receiver circuit 504. In various embodiments, the first etchant 2202 may comprise a dry etchant or a wet etchant.

As shown in cross-sectional view 2206, a first metal material 2208 is formed within the first plurality of openings 2204. In some embodiments, the first metal material 2208 may be formed by way of a vapor deposition technique. In some embodiments, the first metal material 2208 may comprise tungsten (W). In some embodiments, a diffusion barrier layer (not shown) may be deposited into the first plurality of openings 2204 prior to forming the first metal material 2208. In various embodiments, the diffusion barrier layer may comprise titanium nitride (TiN), tantalum nitride (TaN), hafnium nitride (HfN), etc.

Figure 23:
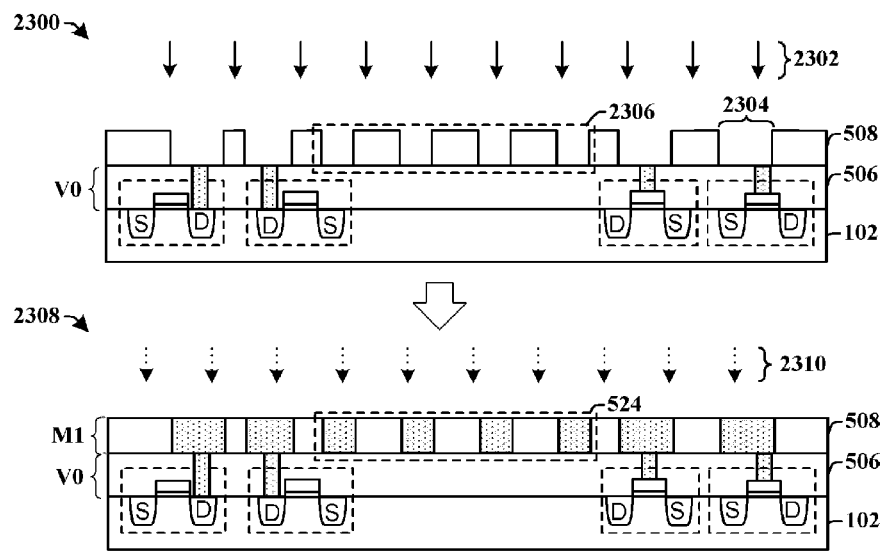

FIG. 23 illustrates cross-sectional views, 2300 and 2308, of an integrated chip corresponding to act 2008.

As shown in cross-sectional view 2300, a second ILD layer 508 (e.g., a low-k dielectric layer) is formed over the first ILD layer 506 (e.g., by way of a vapor deposition technique). The second ILD layer 508 is selectively exposed to a second etchant 2302 (e.g., $CF_4$, $CHF_3$, $C_4F_8$, HF, etc.) configured to selectively etch the second ILD layer 508 to form a second plurality of openings comprising a first plurality of via openings 2304 and a plurality of shielding element openings 2306 laterally disposed from the plurality of via openings 2304. The plurality of shielding element openings 2306 comprise metal trenches extending in parallel to one another.

As shown in cross-sectional view 2308, a second metal material 2310 is formed in the first plurality of via openings 2304 and the plurality of shielding element openings 2306. In some embodiments, a deposition process may be used to form a seed layer within the first plurality of via openings 2304 and the plurality of shielding element openings 2306. A subsequent plating process (e.g., an electroplating process, an electro-less plating process) may be used to form the second metal material to a thickness that fills the first plurality of via openings 2304 and the plurality of shielding element openings 2306. In some embodiments, the second metal material 2310 may comprise copper (Cu). A chemical mechanical polishing (CMP) process may be used to remove excess of the second metal material 2310 from a top surface of the second ILD layer 508.

Figure 24:
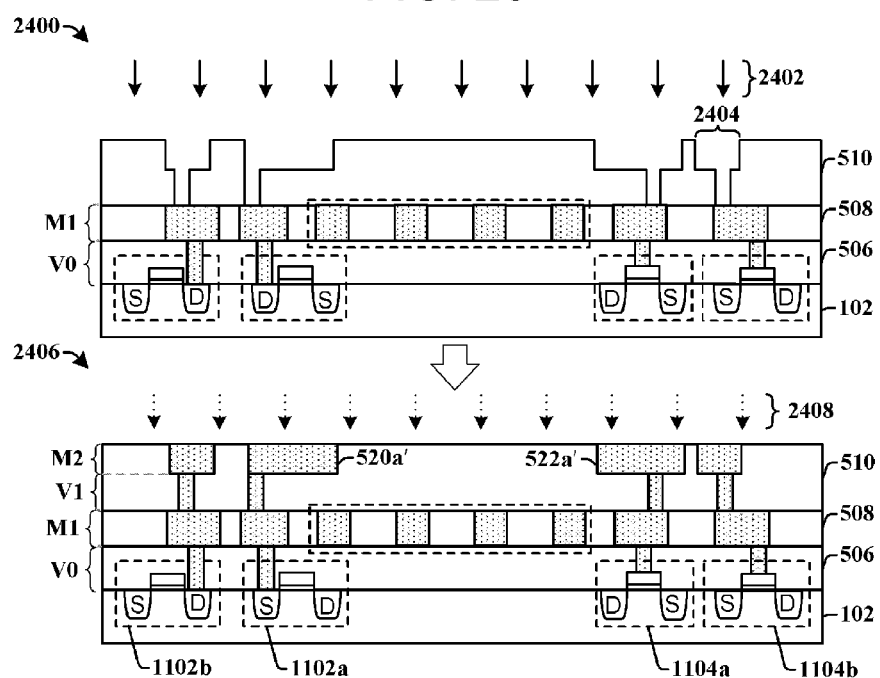

FIG. 24 illustrates cross-sectional views, 2400 and 2402, of an integrated chip corresponding to act 2010.

As shown in cross-sectional view 2400, a third ILD layer 510 is formed onto the second ILD layer 508. The third ILD layer 510 is selectively exposed to a third etchant 2402 (e.g., $CF_4$, $CHF_3$, $C_4F_8$, HF, etc.) configured to etch the third ILD layer 510 to from a third plurality of openings 2404. In some embodiments, the third plurality of openings 2404 comprise a via hole, and an overlying metal wire trench. The via holes vertically extending from a bottom surface of the third ILD layer 510 to a bottom surface of the metal trenches, which extend to a top surface of the third ILD layer 510.

As shown in cross-sectional view 2406, a third metal material 2408 is formed in the third plurality of openings 2404 to form a second via layer V1 and an overlying second metal wire layer M2. The second metal wire layer M2 comprises a first transmission electrode 520a' and a first receiver electrode 522a'. The first transmission electrode 520a' is laterally separated from the first receiver electrode 522a' by way of the third ILD layer 510. In some embodiments, the third metal material 2408 (e.g., copper) may be deposited by way of a deposition process, a subsequent plating process, and a CMP process, as described above.

Although FIG. 24 illustrates the formation of the second via layer V1 and second metal wire layer M2 using a dual damascene process, one of ordinary skill in the art will appreciate that the in alternative embodiments, the second via layer V1 and the second metal wire layer M2 may be formed using a single damascene process. In such embodiments, a first dielectric layer is selectively etched to form via holes, which are subsequently filled. A second dielectric layer is then formed over the first dielectric layer. The second dielectric layer is selectively etched to form metal trenches.

Figure 25:
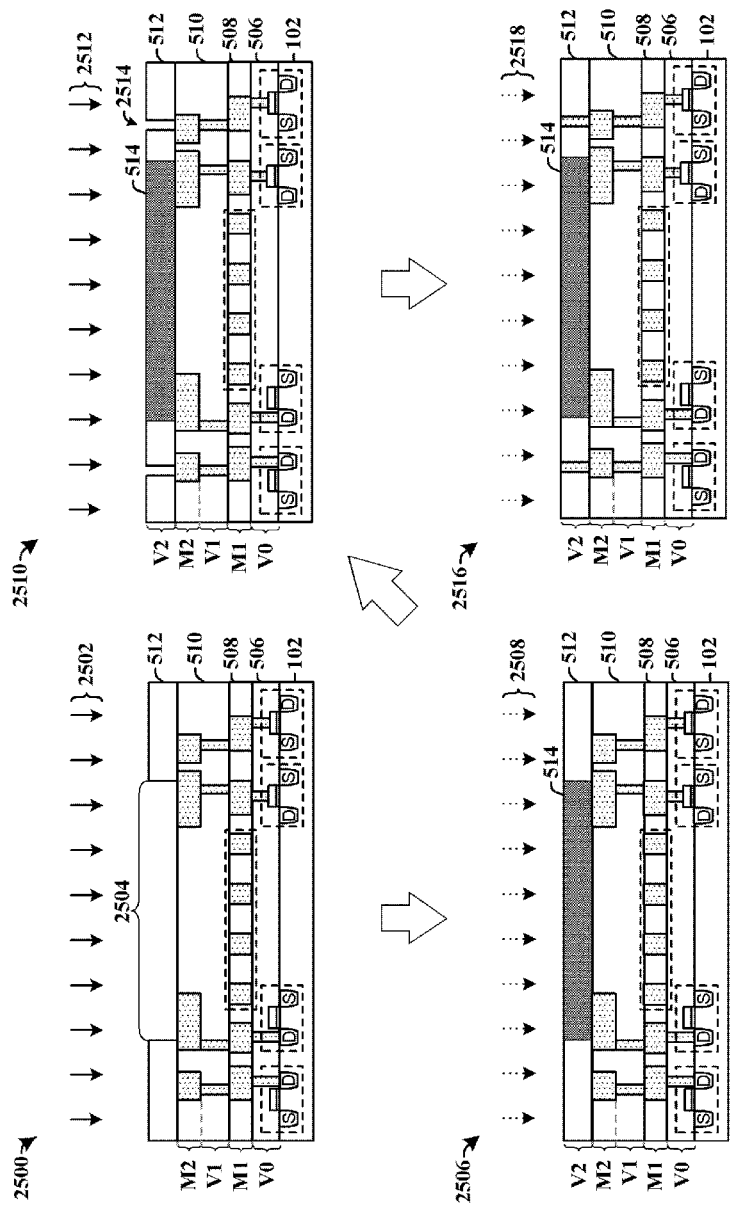

FIG. 25 illustrates some embodiments of cross-sectional views, 2500 and 2502, of an integrated chip corresponding to acts 2012-2018.

As shown in cross-sectional view 2500, a fourth ILD layer 512 is formed over the third ILD layer 510. The fourth ILD layer 512 is selectively exposed to a fourth etchant 2502 (e.g., $CF_4$, $CHF_3$, $C_4F_8$, HF, etc.) configured to etch the fourth ILD layer 512 to form a dielectric waveguide opening 2504. The dielectric waveguide opening 2504 comprises an oblong opening that laterally extends from a first position overlying the first transmission electrode 520a' to a second position overlying the first receiver electrode 522a'.

As shown in cross-sectional view 2506, a dielectric material 2508 is formed within the dielectric waveguide opening 2504. The dielectric material 2508 comprises a higher dielectric constant than the surrounding ILD layers (e.g., ILD layer 510 and 512). In some embodiments, the dielectric material 2508 may be formed by way of a vapor deposition technique (e.g., PVD, CVD, PE-CVD, etc.) to a thickness that fills the dielectric waveguide opening 2504. A chemical mechanical polishing (CMP) process may be used to remove excess of the dielectric material 2508 from a top surface of the fourth ILD layer 512.

As shown in cross-sectional view 2510, the fourth ILD layer 512 is selectively exposed to a fifth etchant 2512 (e.g., $CF_4$, $CHF_3$, $C_4F_8$, HF, etc.) configured to etch the fourth ILD layer 512 to from a second plurality of via holes 2514. The second plurality of via holes 2514 comprise substantially round via openings disposed over an underlying metal layer (i.e., the via holes 2514 are predominately over the underlying second metal layer M2 so as to provide for contact between a subsequently formed via and the underlying second metal layer M2). The second plurality of via holes 2514 are laterally separated from the dielectric waveguide opening 2504 (i.e., the dielectric waveguide opening 2504 is disposed on a same vertical level as the second plurality of via holes 2514).

As shown in cross-sectional view 2516, a fourth metal material 2518 is formed within the second plurality of via holes 2514. In some embodiments, the fourth metal material 2518 (e.g., copper) may be deposited by way of a deposition process, a subsequent plating process, and a CMP process, as described above.

Figure 26:
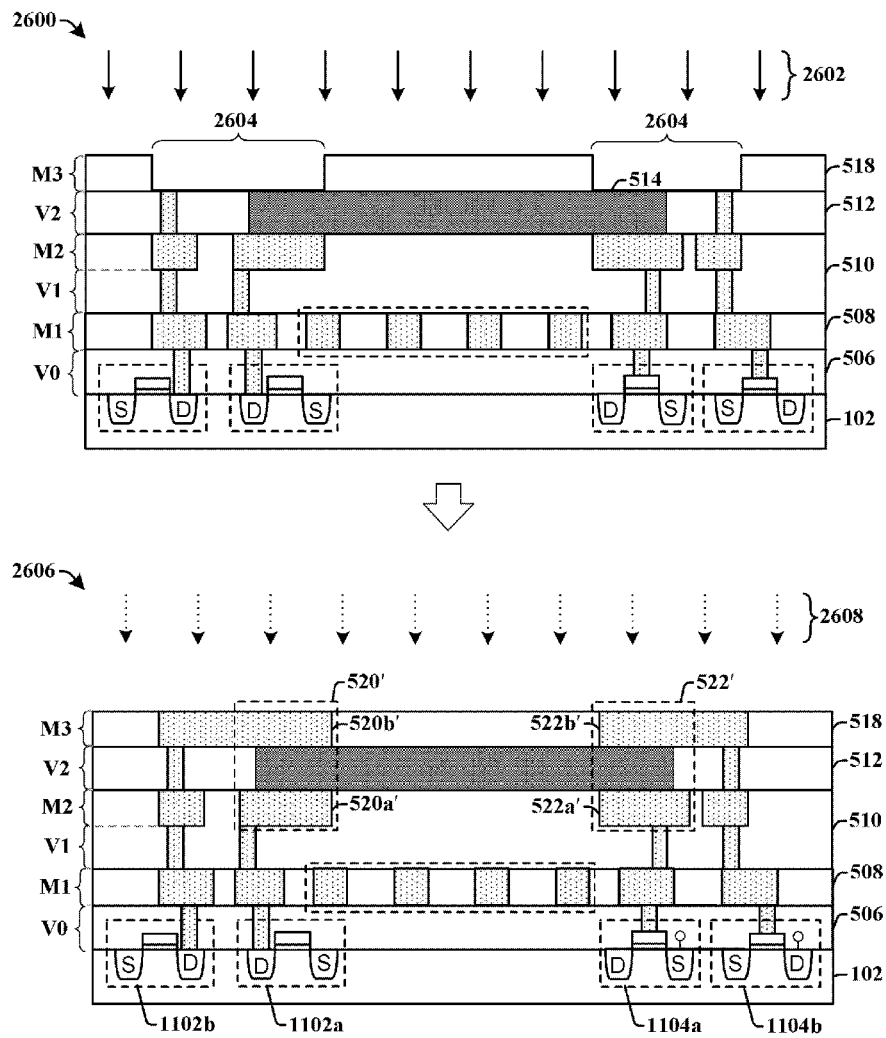

FIG. 26 illustrates some embodiments of cross-sectional views, 2600 and 2606, of an integrated chip corresponding to act 2020.

As shown in cross-sectional view 2600, a fifth ILD layer 518 is formed over the fourth ILD layer 512. The fifth ILD layer 518 is selectively exposed to a sixth etchant 2602 (e.g., $CF_4$, $CHF_3$, $C_4F_8$, HF, etc.) configured to etch the fifth ILD layer 518 to from a fourth plurality of openings 2604 comprising metal trenches that extend through the fifth ILD layer 518.

As shown in cross-sectional view 2606, a fifth metal material 2608 is formed in the fourth plurality of openings 2604. In some embodiments, the fifth metal material 2608 (e.g., copper) may be deposited by way of a deposition process, a subsequent plating process, and a CMP process, as described above. The fifth metal material 2608 forms a second transmission electrode 520b' and a second receiver electrode 522b' within a third metal wire layer M3. The second transmission electrode 520b' is laterally separated from the second receiver electrode 522b' by way of the fifth ILD layer 518.

Figure 27:
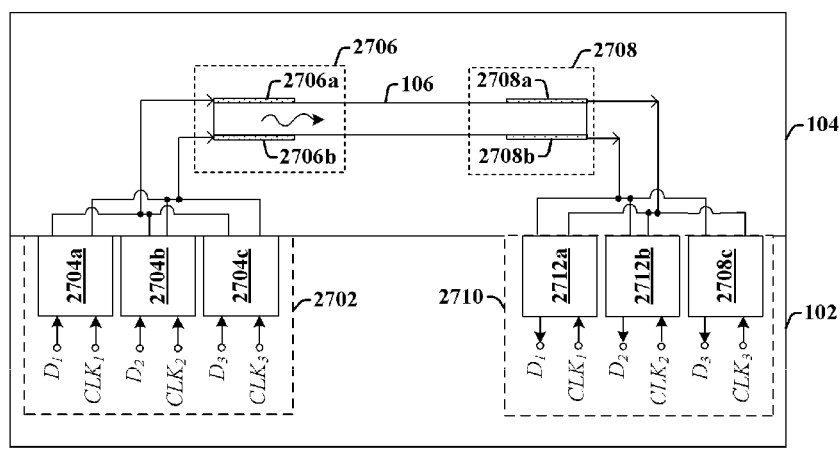
FIG. 27 illustrates some embodiments of a block diagram showing an integrated chip having multiband transmission and reception elements coupled to an integrated dielectric waveguide.

FIG. 27 illustrates some embodiments of a block diagram showing an integrated chip 2700 having multiband transmission and reception elements coupled to an integrated dielectric waveguide.

The integrated chip 2700 comprises a multiband transmission element 2702 having a plurality of phase modulation elements 2704a-2704c. In some embodiments, the plurality of phase modulation elements 2704a-2704c comprise one or more semiconductor devices arranged within a semiconductor substrate 102. The plurality of phase modulation elements 2704a-2704c are configured to modulate data onto different carrier signals (i.e., clock signals) to generate a plurality of modulated signals that are to be transmitted along a dielectric waveguide 106 arranged in a dielectric structure 104 over the semiconductor substrate 102. In some embodiments, the plurality of phase modulation elements 2704a-2704c are configured to respectively modulate data onto a carrier signal by way of a quadrature amplitude modulation (QAM) scheme.

The plurality of phase modulation elements 2704a-2704c are respectively configured to receive a data signal $D_x$ (e.g., where x=1, 2, or 3) and a clock signal $CLK_x$ (e.g., where x=1, 2, or 3). The clock signals $CLK_x$ (i.e., carrier signals) provided to the plurality of phase modulation elements 2704a-2704c are different, which causes the plurality of phase modulation elements 2704a-2704c to generate a plurality of modulated signals within different frequency ranges. For example, a first phase modulation element 2704a is configured to receive a first clock signal $CLK_1$ and to generate a first modulated signal within a first frequency range. Similarly, a second phase modulation element 2704b may be configured to receive a second clock signal $CLK_2$ and to generate a second modulated signal within a second frequency range, and a third phase modulation element 2704c may be configured to receive a third clock signal $CLK_3$ and to generate a third modulated signal within a third frequency range.

The plurality of phase modulation elements 2704a-2704c are coupled to a first coupling element 2706 comprising a plurality of transmission electrodes 2706a-2706b. In some embodiments, the plurality of transmission electrodes 2706a-2706b may comprise one upper electrode and one lower electrode arranged along opposing sides of the dielectric waveguide 106. In other embodiments, the plurality of transmission electrodes 2706a-2706b may comprise multiple upper electrodes and multiple lower electrodes arranged along opposing sides of the dielectric waveguide 106. The first coupling element 2706 forms an interface that couples the plurality of modulated signals into the dielectric waveguide 106. For example, the plurality of modulated signals respectively cause the first coupling element 2706 to generate a plurality of electric fields that extend into the dielectric waveguide 106 and that respectively couple the plurality of modulated signals into the dielectric waveguide 106.

Figure 28:
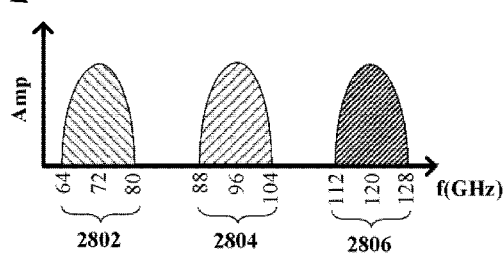
FIG. 28 illustrates an example of some embodiments of a frequency spectrum within the dielectric waveguide of FIG. 27.

An example of some embodiments of a frequency spectrum 2800 within the dielectric waveguide 106 is illustrated in FIG. 28. Within the frequency spectrum 2800, the first modulated signal is arranged within a first frequency range 2802 (e.g., centered around 72 GHz), the second modulated signal is arranged within a second frequency range 2804 (e.g., centered around 96 GHz), and the third modulated signal is arranged within a third frequency range 2806 (e.g., centered around 120 GHz). By transmitting the different modulated signals at different frequency ranges 2802-2806, the dielectric waveguide 106 can concurrently convey the first modulated signal, the second modulated signal, and the third modulated signal on the dielectric waveguide 106. The use of a dielectric waveguide 106 allows for each phase modulation element 2704a-2704c to convey a signal over a large bandwidth (e.g., 16 GHz), resulting in a high overall rate of data transmission.

The dielectric waveguide 106 is configured to convey the first modulated signal, the second modulated signal, and the third modulated signal to a second coupling element 2708 comprising a plurality of receiver electrodes 2708a-2708b arranged along sides of the dielectric waveguide 106. The second coupling element 2708 forms an interface that couples the plurality of modulated signals from the dielectric waveguide 106. The plurality of modulated signals are provided from the second coupling element 2708 to a multiband reception element 2710 configured to demodulate the plurality of modulated signals.

The multiband reception element 2710 comprises a plurality of demodulation elements 2712a-2712c. In some embodiments, the multiband reception element 2710 may have a number of demodulation elements 2712a-2712c that is a same as the number of modulation elements 704a-2704c. For example, the multiband reception element 2710 may comprise a first demodulation element 2712a, a second demodulation element 2712b, and a third demodulation element 2712c. The first demodulation element 2712a is configured to receive the first modulated signal and the first clock signal $CLK_1$ and to demodulate the first modulated signal to recover the first data signal $D_1$. The second demodulation element 2712b is configured to receive the second modulated signal and the second clock signal $CLK_2$ and to demodulate the second modulated signal to recover the second data signal $D_2$. The third demodulation element 2712c is configured to receive the third modulated signal and the third clock signal $CLK_3$ and to demodulate the third modulated signal to recover the third data signal $D_3$. In some embodiments, the multiband reception element 2710 is configured to demodulate data by way of a quadrature amplitude modulation (QAM) scheme.

Figure 29:
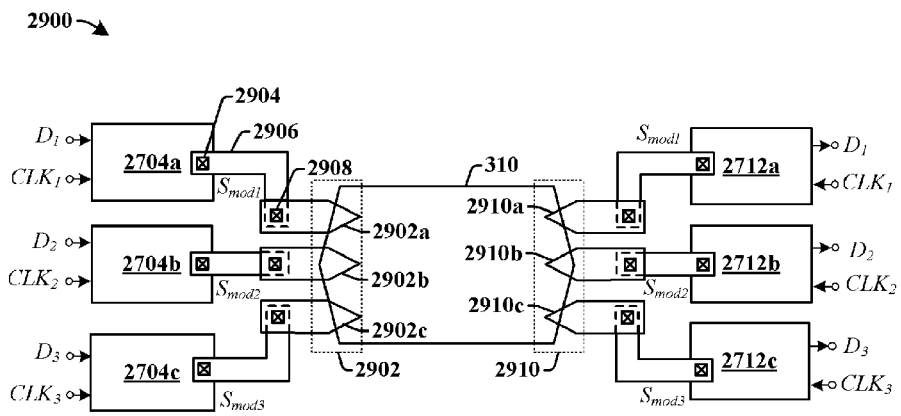
FIG. 29 illustrates a top-view of some embodiments of an integrated chip having multiband transmission and reception elements coupled to an integrated dielectric waveguide.

FIG. 29 illustrates a top-view of some embodiments of an integrated chip 2900 having multiband transmission and reception elements coupled to an integrated dielectric waveguide.

The integrated chip 2900 comprises a plurality of phase modulation elements 2704a-2704c configured to generate a plurality of modulated signals $S_{mod1}$-$S_{mod3}$. The plurality of phase modulation elements 2704a-2704c are respectively coupled one of a plurality of transmission electrodes 2902a-2902c (within a first coupling element 2902) by way of separate conductive paths comprising one or more metal interconnect layers (e.g., a conductive contact 2904, a metal interconnect wire 2906, a metal via 2908, etc.). Connecting each of the plurality of phase modulation elements 2704a-2704c to a separate one of the plurality of transmission electrodes 2902a-2902c reduces inter-band interference between the plurality of different frequency bands. For example, electrically decoupling the plurality of transmission electrodes 2902a-2902c can reduce inter-band interference by more than 10 dB.

The plurality of transmission electrodes 2902a-2902c comprise conductive elements (e.g., metal interconnect wires) arranged over the dielectric waveguide 310, and laterally separated from one another (e.g., by a dielectric material). The plurality of transmission electrodes 2902a-2902c are configured to generate separate electrical fields within the dielectric waveguide 310, which are respectively based upon the plurality of modulated signals $S_{mod1}$-$S_{mod3}$. The separate electric fields couple the plurality of modulated signals $S_{mod1}$-$S_{mod3}$ into the dielectric waveguide 310 at a plurality of different frequency bands that dependent upon clock signals $CLK_1$-$CLK_3$ provided to the plurality of phase modulation elements 2704a-2704c. In some embodiments, the dielectric waveguide 310 has a tapered end with a width that continually decreases from a first width to a second narrower width. In some embodiments, the plurality of transmission electrodes 2902a-2902c straddle the tapered end.

A plurality of receiver electrodes 2910a-2910c (within a second coupling element 2910) are configured to receive the plurality of modulated signals $S_{mod1}$-$S_{mod3}$ from the dielectric waveguide 310. The plurality of receiver electrodes 2910a-2910c comprise conductive elements (e.g., metal interconnect wires) arranged over the dielectric waveguide 310, and laterally separated from one another (e.g., by a dielectric material). The plurality of receiver electrodes 2910a-2910c are respectively coupled to one of a plurality of phase demodulation elements 2712a-2712c configured to demodulate the plurality of modulated signals $S_{mod1}$-$S_{mod3}$ by way of separate conductive paths comprising one or more metal interconnect layers (e.g., a metal wire, a metal via, etc.).

Figure 30B:
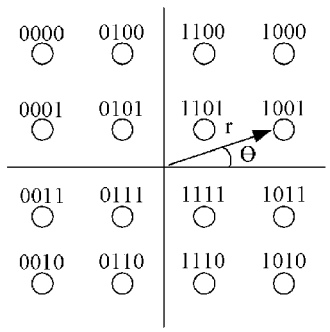
FIGS. 30A-30B illustrate some embodiments of an integrated chip having multiband QAM (quadrature amplitude modulation) interfaces operationally coupled to an integrated dielectric waveguide.
Figure 30A:
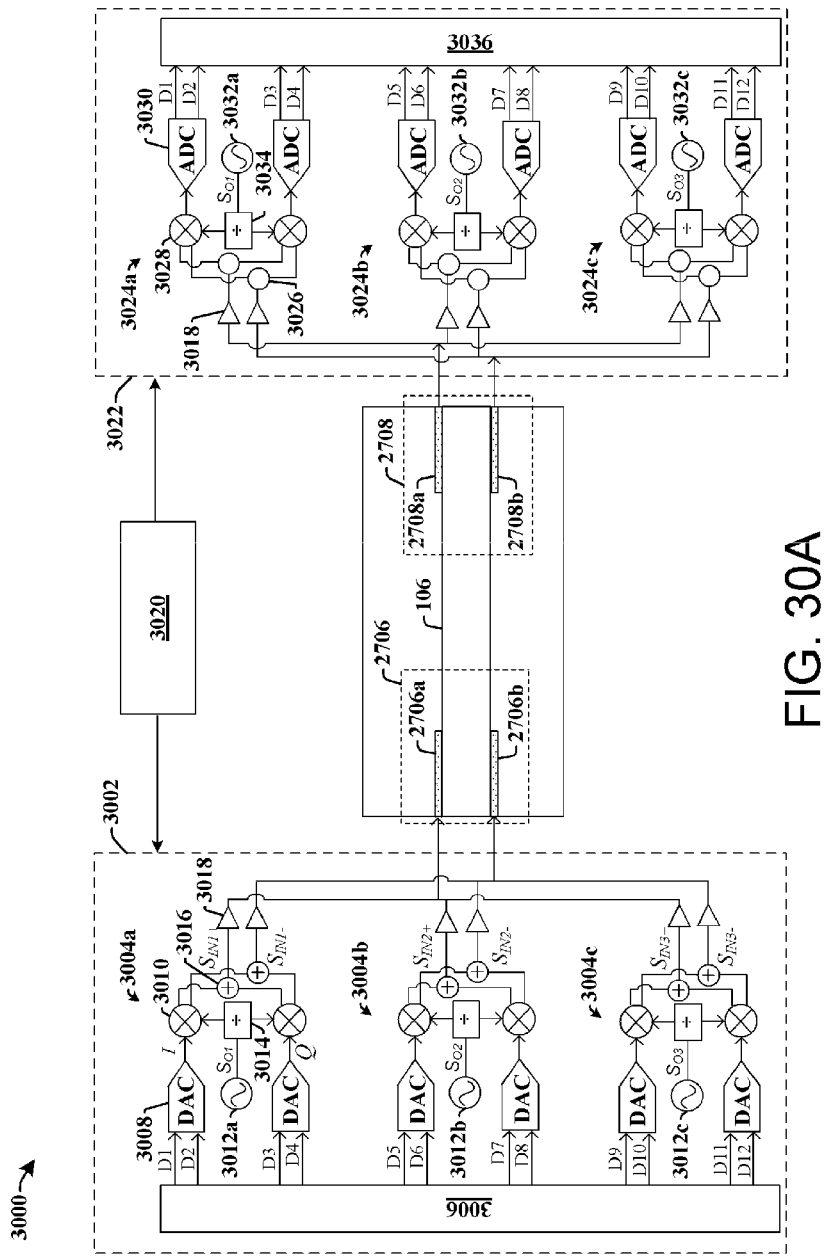

FIGS. 30A-30B illustrate some embodiments of an integrated chip 3000 having multiband QAM (quadrature amplitude modulation) interfaces operationally coupled to an integrated dielectric waveguide.

FIG. 30A illustrates a block diagram of an integrated chip 3000 having multiband QAM (quadrature amplitude modulation) transmission and reception elements operationally coupled to an integrated dielectric waveguide.

The multiband QAM transmitter element 3002 comprises a plurality of QAM modulation elements 3004a-3004c configured generate modulated signals to be transmitted by a dielectric waveguide 106. In some embodiments, the plurality of QAM modulation elements 3004a-3004c may respectively comprise one or more digital-to-analog converters (DACs) 3008 configured to receive data (e.g., 2-bit digital signals) from a baseband processor 3006. From the data, the DACs 3008 generate in-phase (I) and quadrature phase (Q) equivalent baseband signals, which are provided to up-conversion mixers 3010. In some embodiments, the data may be provided to the DACs 3008 at a high data rate (e.g., 8 GB/sec), enabling high overall rate of data transmission (e.g., 96 GB/sec) over the dielectric waveguide 106.

The plurality of QAM modulation elements 3004a-3004c may also respectively comprise a local oscillator 3012 configured to generate an oscillator output signal $S_{ox}$ (e.g., a sin wave) at a high frequency (e.g., 90 GHz). The local oscillators 3012 within the plurality of QAM modulation elements 3004a-3004c are configured to generate oscillator output signals $S_{O1}$-$S_{O3}$ having different frequencies. The oscillator output signals $S_{O1}$-$S_{O3}$ are provided to quadrature dividers 3014 configured to divide the frequency of the oscillator output signals $S_{O1}$-$S_{O3}$ by a division factor to generate local oscillator signals offset by 90°. The local oscillator signals are provided to the up-conversion mixers 3010, which modulate the I and Q equivalent baseband signals onto the local oscillator signals, thereby up-converting the frequency of the I and Q equivalent baseband signals.

The output of the up-conversion mixers 3010 are combined by adders 3016 to form a plurality of modulated input signals. In some embodiments, the plurality of modulated signals respectively have a phase (θ) and a magnitude (r) representative of a data state, as shown in the constellation diagram 3038 of FIG. 30B. For example, a first modulated input signal may have a first phase and amplitude combination corresponding to a first data state, a second modulated input signal may have a second phase and amplitude combination corresponding to a second data state, etc. In some embodiments, the plurality of QAM modulation elements 3004a-3004c are configured to generate differential modulated signals, $S_{INx+}$ and $S_{INx-}$ (where x=1, 2, 3), having a 180° difference therebetween.

In some embodiments, the plurality of modulated signals may be provided to one or more amplification elements before being received by a first coupling element 2706. Since loss increases with frequency, the amplification elements can be operated by a control unit 3020 to apply different gains that adjust the amplitudes of the plurality of modulated signals generated by individual ones of the plurality of QAM modulation elements 3004a-3004c to compensate for channel loss of different frequency bands. For example, a modulated signal in a lowest frequency band may be amplified by smaller gain than modulated signals in a higher frequency band. In some embodiments, the amplification elements may comprise amplifiers 3018 arranged downstream of the up-conversion mixers 3010. In other embodiments (not shown), the amplification elements may comprise amplification elements arranged up-steam of the up-conversion mixers 3010.

A second coupling element 2708, which is coupled to a multiband QAM reception element 3022, is configured to receive the plurality of modulated signals from the dielectric waveguide 106. The multiband QAM reception element 3022 comprises a plurality of QAM demodulation elements 3024a-3024c. The plurality of QAM demodulation elements 3024a-3024c respectively comprise down-conversion mixers 3028 configured to demodulate one of the plurality of modulated signals received from a splitter 3026 based upon local oscillator signals $S_{O1}$-$S_{O3}$ generated by a local oscillator 3032a-3032c and quadrature dividers 3034. An analog-to-digital (ADC) converter 3030 is configured to convert an output of the down-conversion mixers 3028 to digital signals, which are provided to a digital signal processor 3036. In some embodiments, a filter element (e.g., bandpass filter) (not shown) may be located downstream of the down-conversion mixers 3028. The filter element is configured to remove components of a received signal that are outside of a frequency band corresponding to a clock signal of a demodulation element.

Figure 31:
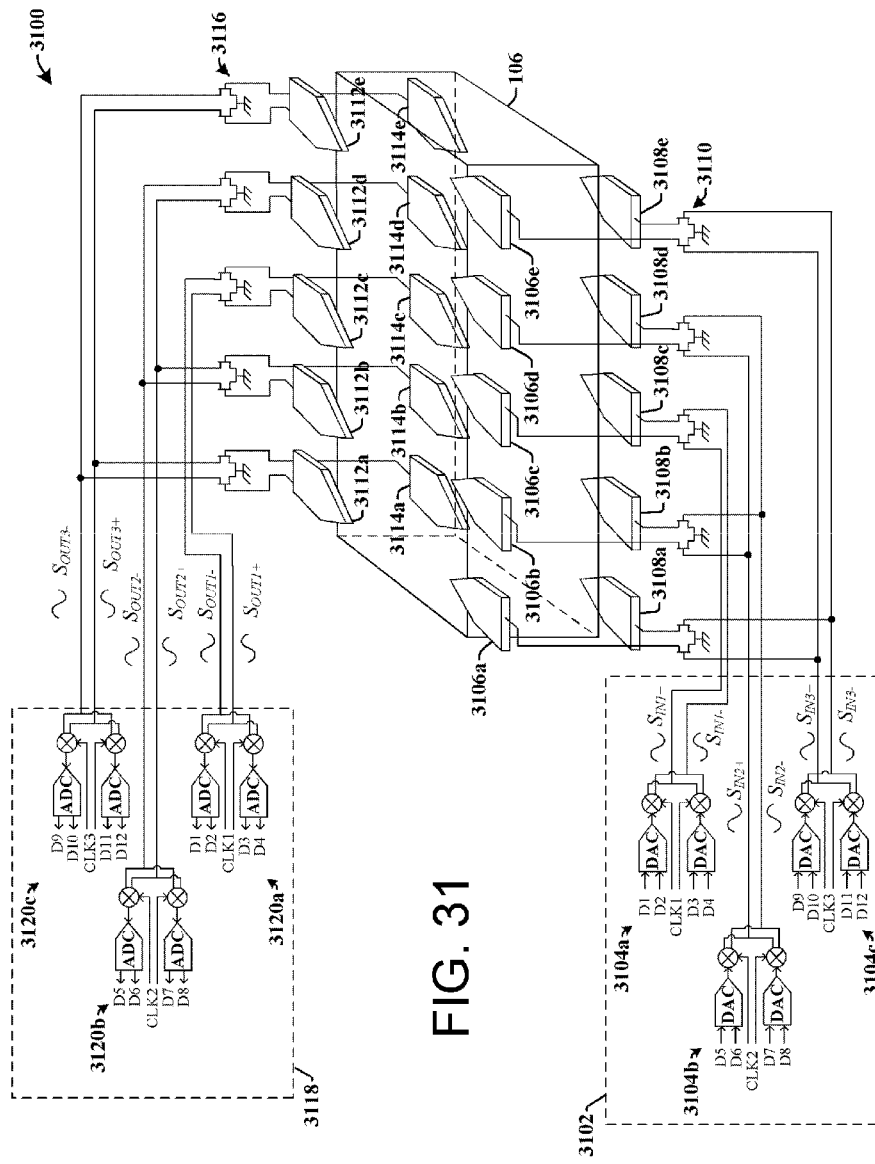
FIG. 31 illustrates some embodiments of a three-dimensional (3D) view of an integrated chip having multiband QAM interfaces operationally coupled to an integrated dielectric waveguide.

FIG. 31 illustrates some embodiments of a three-dimensional (3D) view of a block diagram of an integrated chip 3100 having multiband QAM (quadrature amplitude modulation) transmission and reception elements operationally coupled to an integrated dielectric waveguide.

The integrated chip 3100 comprises a multiband transmission element 3102 having a first QAM modulation element 3104a, a second QAM modulation element 3104b, and a third QAM modulation element 3104c. The first QAM modulation element 3104a is configured to generate first differential modulated input signals, $S_{IN1+}$ and $S_{IN1-}$. The second QAM modulation element 3104b is configured to generate second differential modulated input signals, $S_{IN2+}$ and $S_{IN2-}$. The third QAM modulation element 3104c is configured to generate third differential modulated input signals, $S_{IN3+}$ and $S_{IN3-}$.

The multiband transmission element 3102 is coupled to a plurality of upper transmission electrodes 3106a-3106e (arranged over dielectric waveguide 106) and to a plurality of lower transmission electrodes 3108a-3108e (arranged below dielectric waveguide 106) by way of a first plurality of differential driver circuits 3110. The first plurality of differential driver circuits 3110 are configured to drive one of the plurality of upper transmission electrodes 3106a-3106e and one of the plurality of lower transmission electrodes 3108a-3108e. For example, the first plurality of differential driver circuits 3110 may respectively comprise a first transistor having a first gate coupled to a first differential modulated input signal (e.g., $S_{IN2+}$) and a first drain coupled to one of the plurality of upper transmission electrodes 3106a-3106e, and a second transistor device having a second gate coupled to a second differential modulated input signal (e.g., $S_{IN2-}$) and a second drain coupled to one of the plurality of lower transmission electrodes 3108a-3108e. In some embodiments, the plurality of upper transmission electrodes 3106a-3106e are electrically isolated from one another and the plurality of lower transmission electrodes 3108a-3108e are electrically isolated from one another.

The plurality of upper transmission electrodes 3106a-3106e comprise a first set of transmission electrodes 3108c coupled to the first QAM modulation element 3104a, a second set of transmission electrodes, 3108b and 3108d, coupled to the second QAM modulation element 3104b, and a third set of transmission electrodes, 3108a and 3108e, coupled to the third QAM modulation element 3104c. In some embodiments, one or more of the first, second, or third set of transmission electrodes may comprise multiple transmission electrodes. In some embodiments, the first, second, and third sets of transmission electrodes are arranged in a symmetric configuration. For example, the first set of transmission electrodes may comprise a center electrode, the second set of transmission electrodes may comprise electrodes surrounding the center electrode, and the third set of transmission electrodes may comprise outermost electrodes. In some embodiments, the first, second, and third sets of transmission electrodes are arranged in a configuration dependent upon a carrier frequency of an associated QAM modulation element. For example, the first QAM modulation element 3104a may generate a modulated signal in the lowest frequency band, the second QAM modulation element 3104b may generate a modulated signal in a middle frequency band and the third QAM modulation element 3104c may generate a modulated signal in the highest frequency band. In some embodiments, the QAM modulation element configured to generate a modulated signal in the lowest frequency band may be coupled to a set having less electrodes than QAM modulation elements configured to generate modulated signals in higher frequency bands.

The integrated chip 3100 also comprises a multiband reception element 3118 having a first QAM demodulation element 3120a, a second QAM demodulation element 3120b, and a third QAM demodulation element 3120c. In some embodiments, the multiband reception element 3118 is coupled to a plurality of upper receiver electrodes 3112a-3112e (arranged over dielectric waveguide 106) and to a plurality of lower receiver electrodes 3114a-3114e (arranged below dielectric waveguide 106) by way of a second plurality of differential driver circuits 3116. The second plurality of differential driver circuits 3116 respectively comprise a first transistor having a first gate coupled to one of the plurality of upper receiver electrodes 3112a-3112e and a first drain coupled the multiband reception element 3118, and a second transistor device having a second gate coupled to one of the plurality of lower receiver electrodes 3114a-3114e and a second drain coupled to the multiband reception element 3118.

The plurality of upper receiver electrodes 3112a-3112e comprise a first set of receiver electrodes 3112c coupled to the first QAM demodulation element 3120a, a second set of transmission electrodes, 3112b and 3112d, coupled to the second QAM demodulation element 3120b, and a third set of transmission electrodes, 3112a and 3112e, coupled to the third QAM demodulation element 3120c. In some embodiments, the first, second, and third sets of transmission electrodes are arranged along the dielectric waveguide 106 in a mirror image of the first, second, and third sets of reception electrodes. In some embodiments, the plurality of upper receiver electrodes 3112a-3112e are electrically isolated from one another and the plurality of lower receiver electrodes 3114a-3114e are electrically isolated from one another.

The second plurality of differential driver circuits 3116 are configured to generate a plurality of differential modulated output signal, $S_{OUTx+}$ and $S_{OUTx-}$ (where x=1,2, 3) corresponding to the differential modulated input signals, $S_{OUTx+}$ and $S_{OUTx-}$ (where x=1,2, 3). For example, the differential driver circuits 3116 are configured to generate differential modulated output signals $S_{OUT1+}$ and $S_{OUT1-}$, which correspond to modulated input signal, $S_{IN1+}$ and $S_{ini-}$. Differential modulated output signal, $S_{OUT1+}$ and $S_{OUT1-}$, are provided from the differential driver circuits 3116 to the first QAM demodulation element 3120a, differential modulated output signal, $S_{OUT2+}$ and $S_{OUT2-}$, are provided from the differential driver circuits 3116 to the second QAM demodulation element 3120b, and differential modulated output signal, $S_{OUT3+}$ and $S_{OUT3-}$, are provided from the differential driver circuits 3116 to the third QAM demodulation element 3120c.

Figure 32:
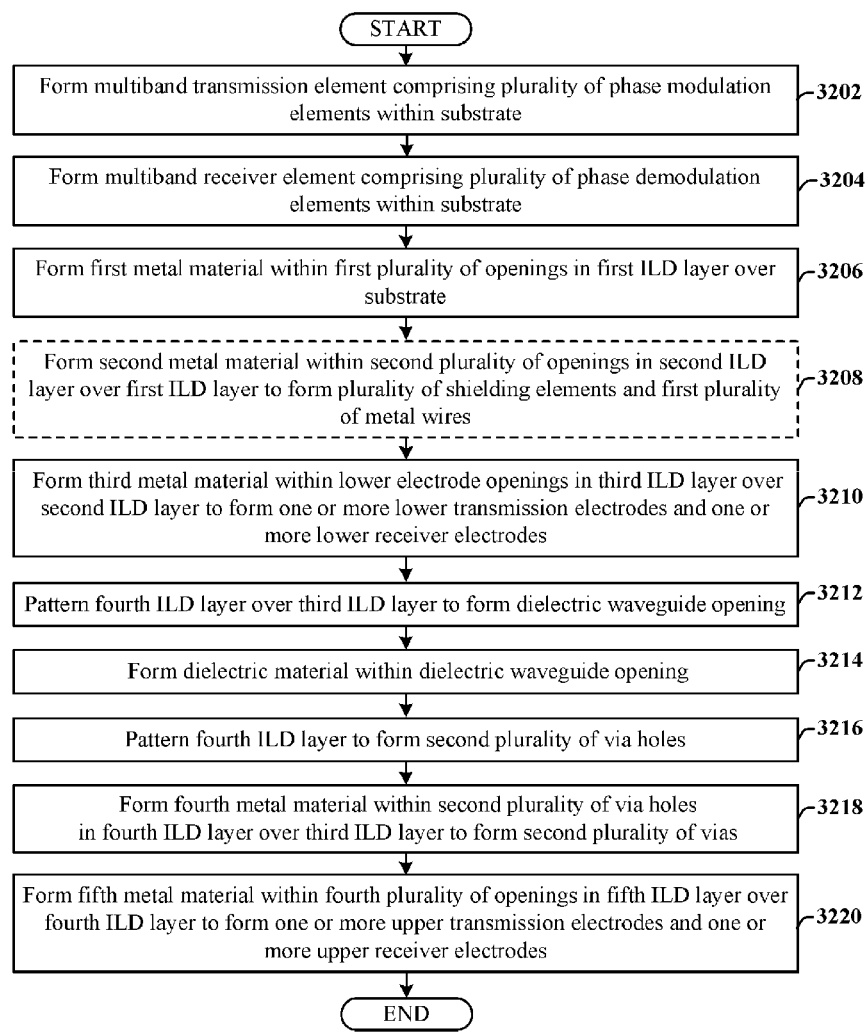
FIG. 32 illustrates a flow diagram of some embodiments of a method of forming an integrated chip comprising a multiband transmission and reception elements coupled to an integrated dielectric waveguide.

FIG. 32 illustrates a flow diagram of some embodiments of a method 3200 of forming an integrated chip comprising multiband transmission and reception elements coupled to an integrated dielectric waveguide.

At 3202, a multiband transmission element comprising a plurality of phase modulation elements is formed within a substrate. The plurality of phase modulation elements are configured to generate a plurality of modulated signals at different frequency ranges.

At 3204, a multiband receiver element comprising a plurality of phase demodulation elements is formed within the substrate. The plurality of phase demodulation elements are configured to demodulate the plurality of modulated signals.

At 3206, a first metal material is formed within a first plurality of openings in a first ILD layer to form a first via layer. The first via layer comprises a plurality of vias contacting the plurality of phase modulation elements and the plurality of phase demodulation elements.

At 3208, a second metal material is formed within a second plurality of shielding element openings and a first plurality of metal wire trenches formed within a second ILD layer overlying the first ILD layer. Forming the second metal material within the plurality of shielding element openings forms a shielding element comprising a plurality of grounded metal wires within the second ILD layer, which are arranged in parallel.

At 3210, a third metal material is formed within a lower electrode openings within a third ILD layer to form one or more lower transmission electrodes and one or more lower receiver electrodes. The plurality of phase modulation elements are coupled to at least one of the one or more lower transmission electrodes. The plurality of phase demodulation elements are coupled to at least one of the one or more lower receiver electrodes.

At 3212, a fourth ILD layer overlying the third ILD layer is patterned to form a dielectric waveguide opening. The dielectric waveguide opening has a first end that overlies the plurality of lower transmission electrodes and a second end that overlies the plurality of lower receiver electrodes.

At 3214, a dielectric material is formed within the dielectric waveguide opening to form a dielectric waveguide within the fourth ILD layer. The dielectric material has a greater dielectric constant than that of surrounding ILD layers.

At 3216, the fourth ILD layer is patterned to form a second plurality of via holes within the fourth ILD layer.

At 3218, a fourth metal material is formed within the second plurality of via holes.

At 3220, a fifth metal material is formed within upper electrode openings within a fifth ILD layer overlying the fourth ILD layer to form one or more upper transmission electrodes and one or more upper receiver electrodes. The plurality of phase modulation elements are coupled to at least one of the one or more upper transmission electrodes. The plurality of phase demodulation elements are coupled to at least one of the one or more upper receiver electrodes.

Therefore, the present disclosure relates to an integrated chip comprising a multiband transmission and reception elements coupled to an integrated dielectric waveguide.

Figure 33:
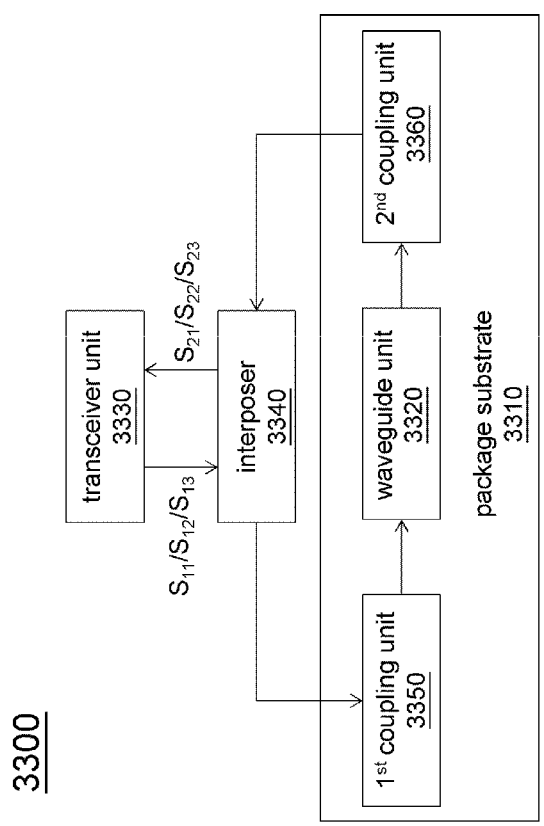
FIG. 33 is a bock diagram of an exemplary integrated chip in accordance with some embodiments.

FIG. 33 is a block diagram of an exemplary integrated chip 3300 in accordance with some embodiments. In the example of FIG. 33, the integrated chip 3300 includes a package substrate 3310, a waveguide unit 3320, a transceiver unit 3330, an interposer 3340, and first and second coupling units 3350, 3360. In this embodiment, the integrated chip 3300 is a three-dimensional integrated chip (3DIC), such as an integrated fan out (InFO) package, or other type of integrated chip.

The waveguide unit 3320 is disposed within the package substrate 3310. Waveguides are typically arranged along the length of a package substrate. This arrangement can result in an undesirable wide area being occupied by the waveguides, increasing a width of an integrated chip. As described below, waveguides of the waveguide unit 3320 are stacked in a direction transverse to the direction of the length of the package substrate 3310. Such an arrangement narrows an area occupied by the waveguide unit 3320.

The transceiver unit 3330 is disposed above the package substrate 3310 and is configured to generate a plurality of first electrical signals (S11, S12, S13). The first coupling unit 3350 is disposed within the package substrate 3310. The first coupling unit 3350 is configured to receive the first electrical signals (S11, S12, S13) through the interposer 3340. The first coupling unit 3350 is further configured to couple each first electrical signal (S11, S12, S13) to the waveguide unit 3320 as a respective electromagnetic radiation. In certain embodiments, the electromagnetic radiations have millimeter (mm) wave frequencies.

The waveguide unit 3320 is configured to convey the electromagnetic radiations along the length thereof. The second coupling unit 3360 is disposed within the package substrate 3310. The second coupling unit 3360 is configured to couple each electromagnetic radiation from the waveguide unit 3320 as a respective second electrical signal (S21, S22, S23) to the transceiver unit 3330 through the interposer 3340.

Figure 34B:
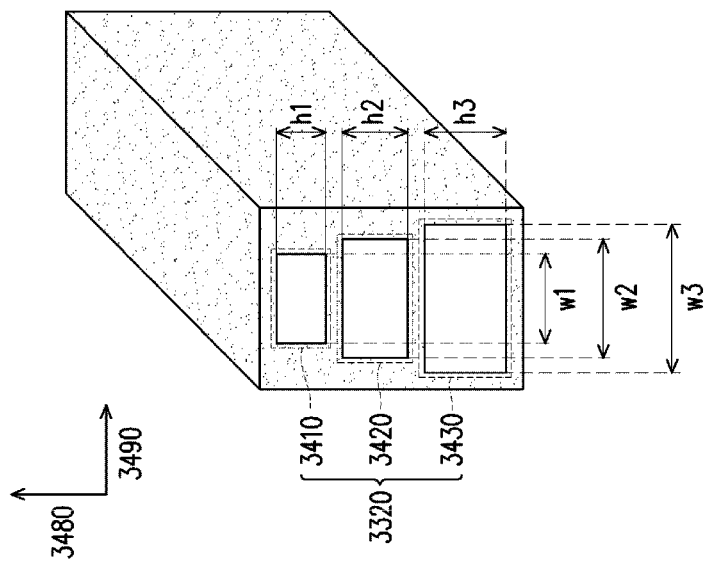
FIG. 34B is a three-dimensional view illustrating an exemplary waveguide unit in accordance with some embodiments.
Figure 34A:
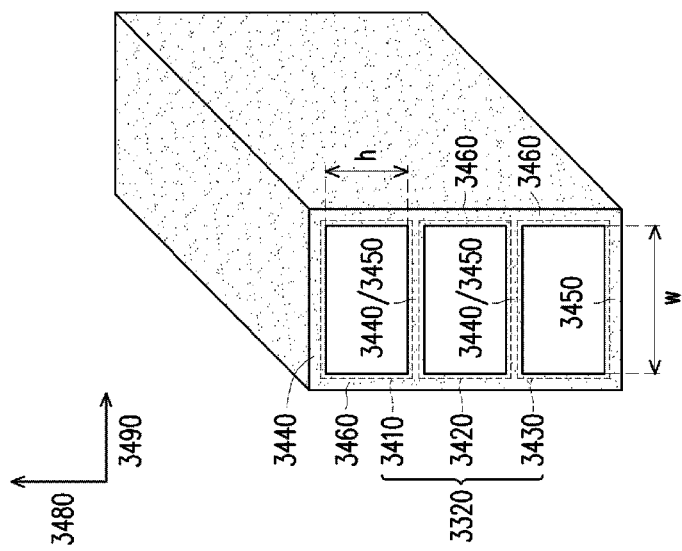
FIG. 34A is a three-dimensional view illustrating an exemplary waveguide unit in accordance with some embodiments.

FIG. 34A is a three-dimensional view illustrating an exemplary waveguide unit 3320 in accordance with some embodiments. In the example of FIG. 34A, the waveguide unit 3320 includes a plurality of waveguides 3410, 3420, 3430 stacked along a direction (as indicated by arrow 3480) transverse to the direction of the length of the package substrate 3310 (as indicated by arrow 3490). Each waveguide 3410, 3420, 3430 has a top wall 3440, a bottom wall 3450, and a sidewall 3460. In this embodiment, the waveguides 3410, 3420, 3430 abut one another. For example, the bottom wall 3450 of an upper waveguide, e.g., waveguide 3410, and the top wall 3440 of a lower waveguide, e.g., waveguide 3430, serve as the top and bottom walls 3440, 3450 of a waveguide, e.g., waveguide 3420, between the upper and lower waveguides. In an alternative embodiment, at least two of the waveguides 3410, 3420, 3430 are spatially separated from one another.

In this embodiment, the waveguides 3410, 3420, 3430 are rectangular waveguides and have the same width (w) and height (h). The height (h) may be in the range of between about 100 nm and about 2 μm. The width (w) may be in the range of about 5 to about 15 times the height (h). In certain embodiments, the width/height (w/h) of at least one of the waveguides 3410, 3420, 3430 may vary along the length thereof. In some embodiments, at least one of the waveguides 3410, 3420, 3430 is a cylindrical waveguide. In other embodiments, at least one of the waveguides 3410, 3420, 3430 may have a cross section of any shape, e.g., triangular, trapezoidal, and the like.

In an alternative embodiment, at least two of the waveguides 3410, 3420, 3430 have different widths/heights, an example of which is illustrated in FIG. 34B. FIG. 34B is a three-dimensional view illustrating an exemplary waveguide unit 3320 in accordance with some embodiments. In the example of FIG. 34B, the waveguide 3420 has a width/height (w2/h2) larger than a width/height (w1/h1) of the waveguide 3410, but smaller than a width/height (w3/h3) of the waveguide 3430. The construction as such results in different cut off frequencies for the waveguides 3410, 3420, 3430, reducing noise interference among the waveguides 3410, 3420, 3430.

Although the waveguide unit 3320 is exemplified in FIGS. 15A and 15B using three waveguides 3410, 3420, 3430, it should be understood that, after reading this disclosure, the waveguide unit 3320 may have any number of waveguides.

Figure 35:
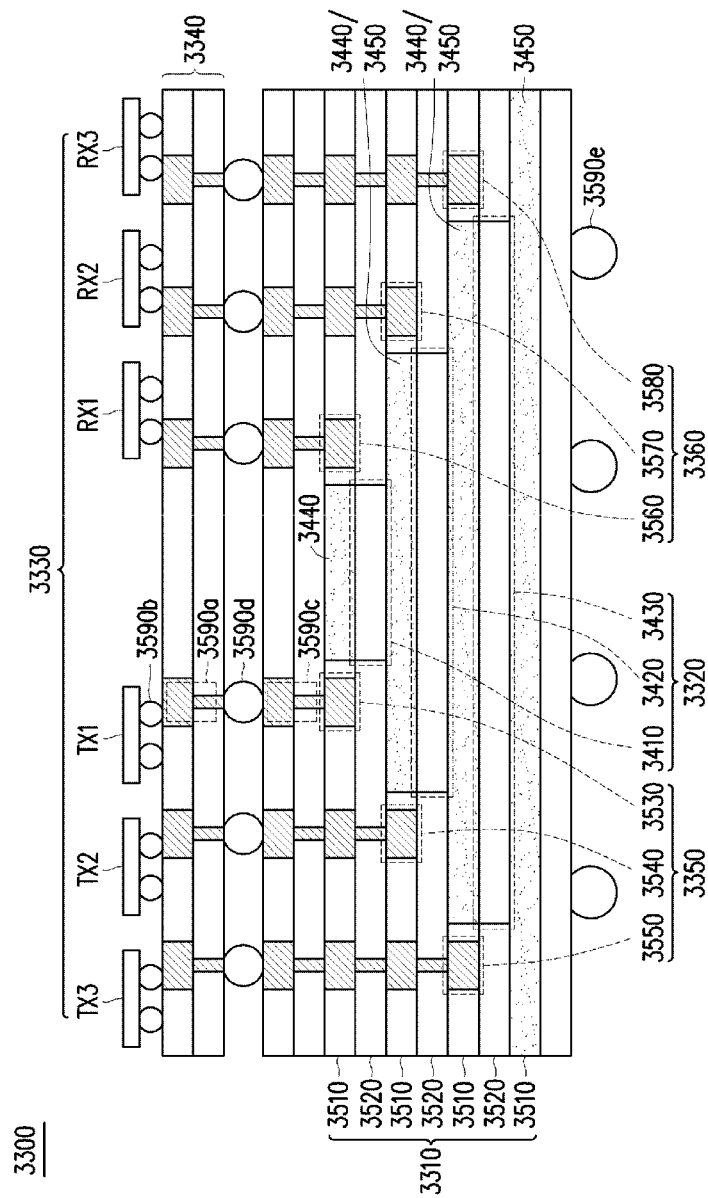
FIG. 35 is a cross-sectional view illustrating an exemplary integrated chip in accordance with some embodiments.

FIG. 35 is a cross-sectional view illustrating an exemplary integrated chip 3330 in accordance with some embodiments. In the example of FIG. 35, the package substrate 3310 includes a plurality of first layers 3510 and a plurality of second layers 3520. Each second layer 3520 is disposed between a respective adjacent pair of first layers 3510. The top and bottom walls 3440, 3450 of the waveguides 3410, 3420, 3430 are formed in the first layers 3510 of the package substrate 3310. The sidewalls 3460 of the waveguides 3410, 3420, 3430 are formed in the second layers 3520 of the package substrate 3310.

In some embodiments, at least one of the waveguides 3410, 3420, 3430 includes copper, tungsten, aluminum, other conductive material, or an alloy thereof. In other embodiments, at least one of the waveguides 3410, 3420, 3430 includes a dielectric material, e.g., TiO2, SiN, SiC, or other high-k dielectric material. In such other embodiments, the first and second layers 3510, 3520 of the package substrate 3310 include a dielectric material, e.g., SiO2 or other low-k dielectric material, that has a lower dielectric constant than the dielectric material of the waveguide. This facilitates confinement of an electromagnetic radiation within the waveguide by total internal reflection, permitting the waveguide 3410, 3420, 3430 to convey an electromagnetic radiation along the length thereof.

The transceiver unit 3330 includes a plurality of transmitters (TX1, TX2, TX3) and a plurality of receivers (RX1, RX2, RX3). Each transmitter (TX1, TX2, TX3) is configured to generate a respective first electrical signal (S11, S12, S13). The interposer 3340 includes a plurality of first interconnects 3590a, only one of which is labeled in FIG. 35. The first interconnects 3590a include metal lines for providing lateral connections and vias for providing vertical connections. The integrated chip 3300 further includes a plurality of first bumps 3590b, only one of which is labeled in FIG. 35. The first bumps 3590b connect the transceiver unit 3330 to the interposer 3340.

The first coupling unit 3350 includes a plurality of first couplers 3530, 3540, 3550 formed in the first layers 3510 of the package substrate 3310. Each first coupler 3530, 3540, 3550 is disposed adjacent a first end of a respective waveguide 3410, 3420, 3430. The second coupling unit 3360 includes a plurality of second couplers 3560, 3570, 3580 formed in the first layers 3510 of the package substrate 3310. Each second coupler 3560, 3570, 3580 is disposed adjacent a second end of a respective waveguide 3410, 3420, 3430. The package substrate 3310 further includes a plurality of second interconnects 3590c, only one of which is labeled in FIG. 35. The second interconnects 3590c include metal lines for providing lateral connections and vias for providing vertical connections. The integrated chip 3300 further includes a plurality of second bumps 3590d, only one of which is labeled in FIG. 35. The second bumps 3590d connect the package substrate 3310 to the interposer 3340. The first and second interconnects 3590a, 3590c include copper, tungsten, aluminum, other conductive material, or an alloy thereof.

Each first coupler 3530, 3540, 3550 is configured to couple the respective first electrical signal (S11, S12, S13) to the first end of the respective waveguide 3410, 3420, 3430 as the respective electromagnetic radiation. Each waveguide 3410, 3420, 3430 is configured to guide the respective electromagnetic radiation from the first end thereof to the second end thereof. Each second coupler 3560, 3570, 3580 is configured to couple the respective electromagnetic radiation from the second end of the respective waveguide 3410, 3420, 3430 as the respective second electrical signal (S21, S22, S23) to a respective receiver (RX1, RX2, RX3). In some embodiments, the couplers 3530-3580 includes a transducer, an antenna (such as a dipole antenna, a metal transmission line, a micro-strip line, and the like), or other type of coupler. In certain embodiments, the first/second end of at least one of the waveguides 3410, 3420, 3430 is tapered, increasing efficiency by which an electromagnectic radiation is coupled between a coupler and a waveguide, reducing reflection between the coupler and the waveguide.

The integrated chip 3300 further includes a plurality of third bumps 3590e, only one of which is labeled in FIG. 35. The third bumps 3590e connect the package substrate 3310 to a packaging structure, such as a printed circuit board (PCB). The bumps 3590b, 3590d, 3590e include copper, tungsten, aluminum, other conductive material, or an alloy thereof.

Figure 36:
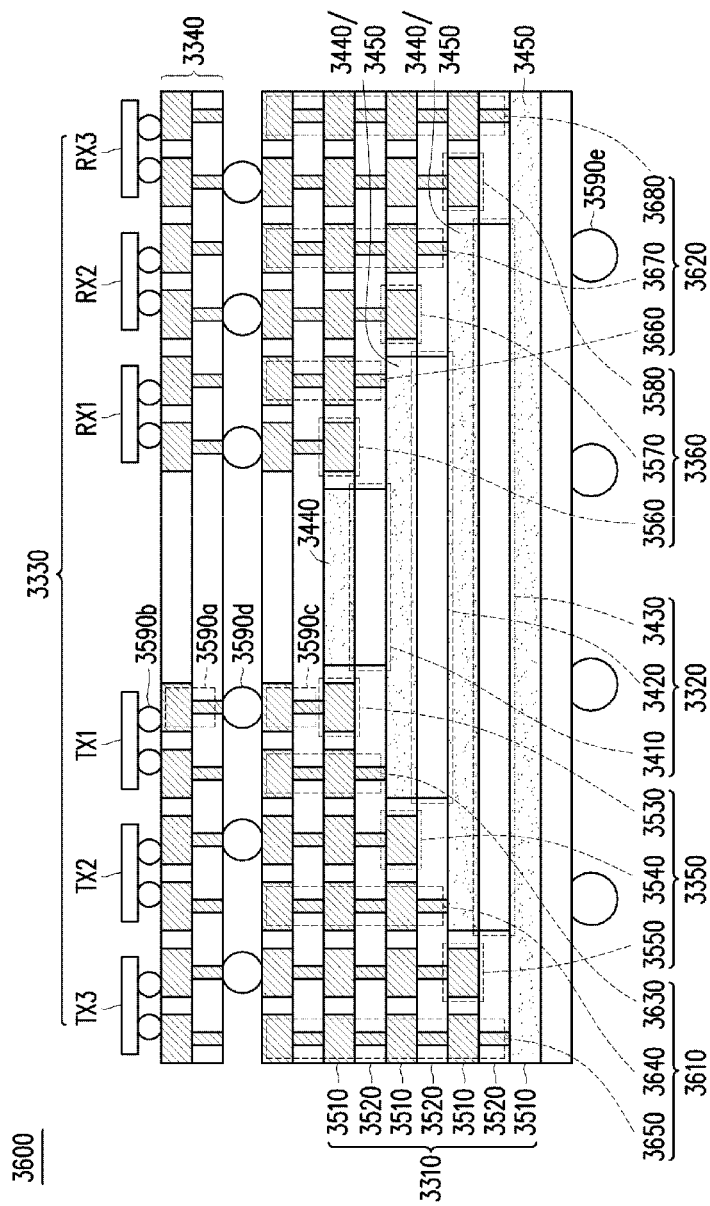
FIG. 36 is a cross-sectional view illustrating an exemplary integrated chip in accordance with some embodiments.

FIG. 36 is a cross-sectional view illustrating an exemplary integrated chip 3600 in accordance with some embodiments. This embodiment differs from the integrated chip 3300 in that the integrated chip 3600 further includes first and second shield units 3610, 3620 configured to minimize crosstalk among the waveguides 3410, 3420, 3430. As can be seen from FIG. 36, the waveguides 3410, 3420, 3430 have different lengths. This facilitates formation of the shield units 3610, 3620. For example, the first shield unit 3610 includes a plurality of shields 3630, 3640, 3650. Each shield 3630, 3640, 3650 connects the bottom wall 3450 of a respective waveguide 3410, 3430, 3440 to a ground. Each first coupler 3530, 3540, 3550 is disposed between a respective waveguide 3410, 3420, 3430 and a respective shield 3630, 3640, 3650.

Similarly, the second shield unit 3620 includes a plurality of shields 3660, 3670, 3680. Each shield 3660, 3670, 3680 connects the bottom wall 3450 of the respective waveguide 3410, 3430, 3440 to the ground. Each second coupler 3560, 3570, 3580 is disposed between the respective waveguide 3410, 3420, 3430 and a respective shield 3660, 3670, 3680.

Figure 37:
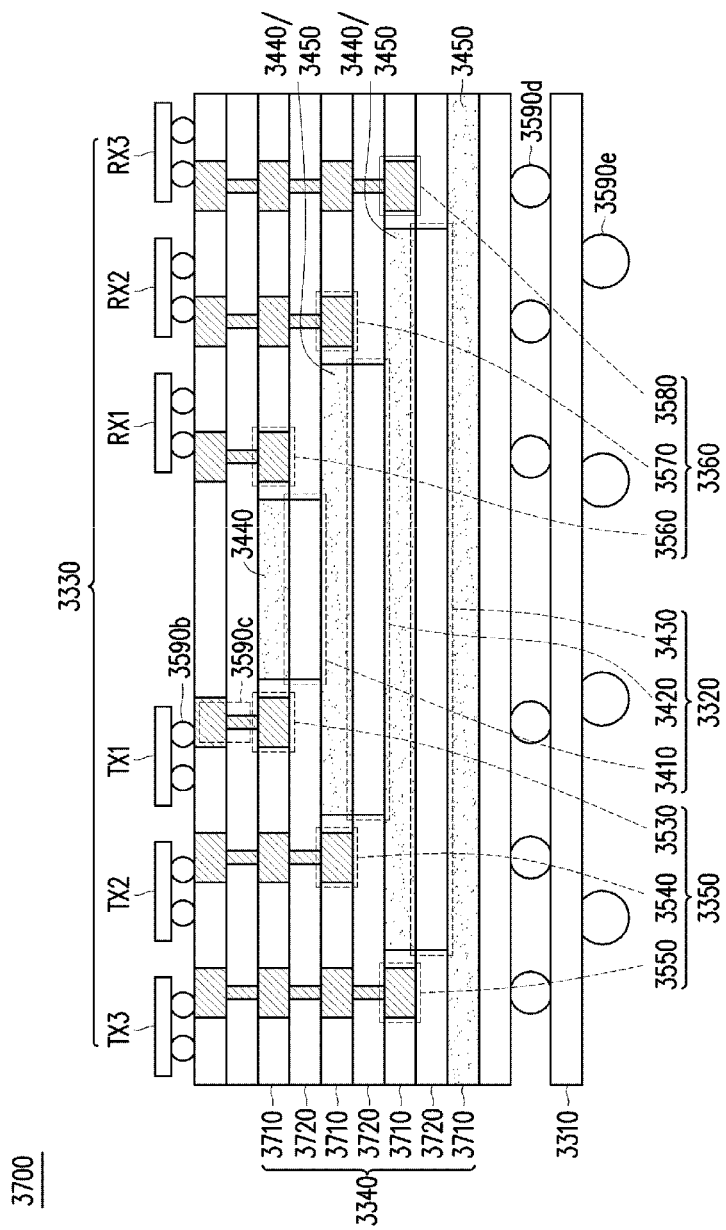
FIG. 37 is a cross-sectional view illustrating an exemplary integrated chip in accordance with some embodiments.

In an alternative embodiment, instead of within the package substrate 3310, the waveguide unit 3320 is disposed within the interposer 3340, an example of which is shown in FIG. 37. FIG. 37 is a cross-sectional view illustrating an exemplary integrated chip 3700 in accordance with some embodiments. In the example of FIG. 37, the interposer 3340 includes a plurality of first layers 3710 and a plurality of second layers 3720. Each second layer 3720 is disposed between a respective adjacent pair of first layers 3710. The top and bottom walls 3440, 3450 of the waveguides 3410, 3420, 3430 are formed in the first layers 3710 of the interposer 3740. The sidewalls 3460 of the waveguides 3410, 3420, 3430 are formed in the second layers 3720 of the interposer 3340. The first and second couplers 3530-3580 are formed in the first layers 3710 of the interposer 3340.

In this embodiment, the package substrate 3710 is a bulk substrate. Examples of materials for the package substrate 3710 include, but are not limited to, Si, Ge, other suitable elementary substrate material, SiC, GaAs, GaP, InP, other suitable compound substrate material, and the like. In an alternative embodiment, the package substrate 3710 is a semiconductor-on-insulator (SOI) substrate, a ceramic substrate, a quartz substrate, a glass substrate, or the like. In certain embodiments, the integrated chip 3700 further includes one or more waveguides disposed within the package substrate 3710. In such certain embodiments, the package substrate 3710 has a similar structure to the package substrate 3310.

Figure 38:
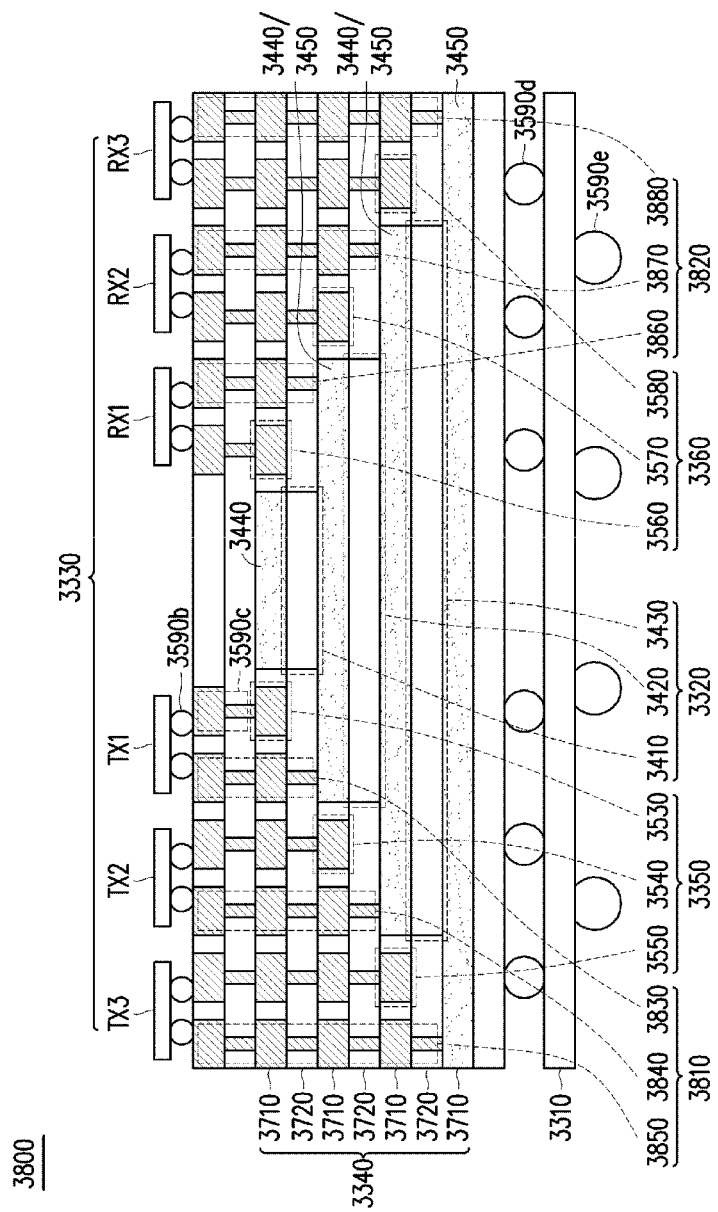
FIG. 38 is a cross-sectional view illustrating an exemplary integrated chip in accordance with some embodiments.

FIG. 38 is a cross-sectional view illustrating an exemplary integrated chip 3800 in accordance with some embodiments. This embodiment differs from the integrated chip 3700 in that the integrated chip 3800 further includes first and second shield units 3810, 3820 configured to prevent crosstalk among the waveguides 3510, 3520, 3530. As can be seen from FIG. 38, the waveguides 3410, 3420, 3430 have different lengths. This facilitates formation of the shield units 3810, 3820. For example, the first shield unit 3810 includes a plurality of shields 3830, 3840, 3850. Each shield 3830, 3840, 3850 connects the bottom wall 3450 of a respective waveguide 3410, 3430, 3440 to the ground. Each first coupler 3530, 3540, 3550 is disposed between a respective waveguide 3410, 3420, 3430 and a respective shield 3830, 3840, 3850.

Similarly, the second shield unit 3820 includes a plurality of shields 3860, 3870, 3880. Each shield 3860, 3870, 3880 connects the bottom wall 3450 of the respective waveguide 3410, 3420, 3430 to the ground. Each second coupler 3560, 3570, 3580 is disposed between the respective waveguide 3410, 3420, 3430 and a respective shield 3860, 3870, 3880.

Figure 39:
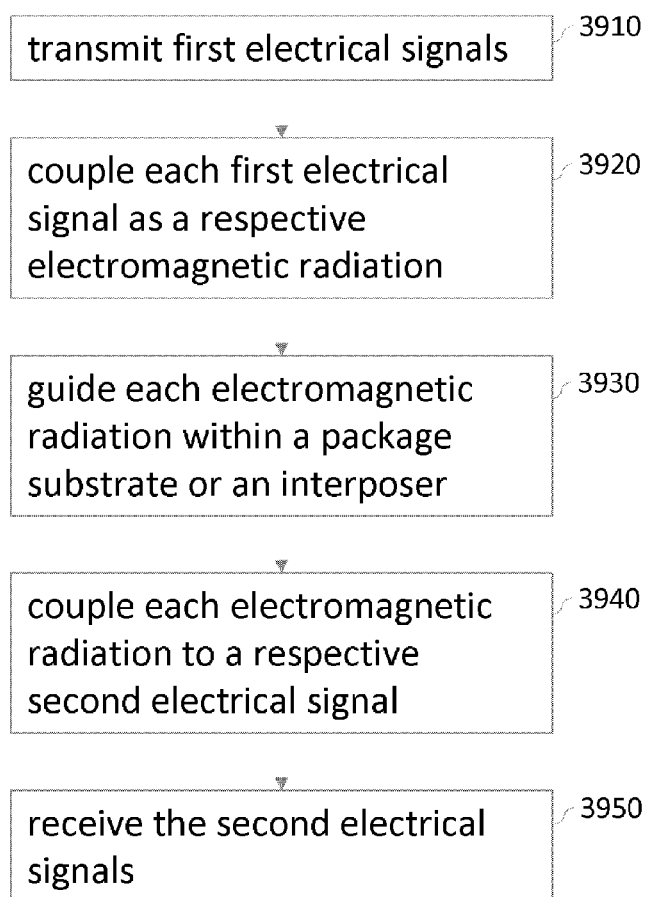
FIG. 39 is a flowchart illustrating an exemplary method of operation of an integrated chip in accordance with some embodiments.

FIG. 39 is a flow chart illustrating an exemplary method 3900 of operation of an integrated chip, e.g. integrated chip 3300/3600/3700/3800, in accordance with some embodiments. The method 3900 will now be described with further reference to FIGS. 34A, 33B, and 35-38 for ease of understanding. It is understood that the method is applicable to structures other than those of FIGS. 34A, 34B, and 35-38. Further, it is understood that additional operations can be provided before, during, and after the method, and some of the operations described below can be replaced or eliminated, in an alternative embodiment of the method 3900. In operation 3910, the transceiver unit 3330 transmits first electrical signals (e.g., $S_{11}$, $S_{12}$, $S_{13}$ in FIG. 1). In operation 3920, the first coupling unit 3350 couples each first electrical signal (e.g., $S_{11}$, $S_{12}$, $S_{13}$) to a first end of a respective waveguide 3410, 3420, 3430 as a respective electromagnetic radiation. In some embodiments, the waveguide unit 3320 within the package substrate 3310. In other embodiments, the waveguide unit 3320 is within the interposer 3340. In operation 3930, each waveguide 3410, 3420, 3430 guides a respective electromagnetic radiation along the length thereof. That is, the waveguide unit 3320 conveys the electromagnetic radiations parallel to each other. As such, smaller amplitude signals can be conveyed by waveguide unit 3320, thereby decreasing loss between the waveguides 3410, 3420, 3430. In operation 3940, the second coupling unit 3360 couples each electromagnetic radiation from a second end a respective waveguide 3410, 3420, 3430 as a respective second electrical signal (e.g., $S_{21}$, $S_{22}$, $S_{23}$ in FIG. 1). In operation 3950, the transceiver unit 3330 receives the second electrical signals (S11, S12, S13).

In some embodiments, an integrated chip includes a package substrate including a plurality of first layers and a plurality of second layers, each second layer being disposed between a respective adjacent pair of the first layers. A transceiver unit is disposed above the package substrate. A waveguide unit including a plurality of waveguides having top and bottom walls formed in the first layers of the package substrate and sidewalls formed in the second layers of the package substrate.

In other embodiments, an integrated chip includes a package substrate. A transceiver unit is disposed above the package substrate. An interposer is disposed between the package substrate and the transceiver unit and including a plurality of first layers and a plurality of second layers, each second layer being disposed between a respective adjacent pair of the first layers. A waveguide unit including a plurality of waveguides having top and bottom walls formed in the first layers of the interposer and sidewalls formed in the second layers of the interposer.

In yet other embodiments, a method includes transmitting first electrical signals. Each first electrical signal is coupled to a first end of a respective waveguide within one of a package substrate and an interposer as a respective electromagnetic radiation. Each electromagnetic radiation is coupled as a respective second electrical signal, and the second electrical signals are received.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
a package substrate including a plurality of first layers and a plurality of second layers, each second layer being disposed between a respective adjacent pair of the first layers;
a transceiver unit disposed above the package substrate and including a transmitter and a receiver;
a waveguide unit including a plurality of waveguides having a length extending in a first direction, arranged along a second direction transverse to the first direction, and including top and bottom walls formed in the first layers of the package substrate and sidewalls formed in the second layers of the package substrate, wherein the top and bottom walls are of a different material than the first and second layers, and
wherein the bottom wall of a first waveguide of the plurality of waveguides has a wider width than a waveguide opening of the first waveguide, serves as the top wall of a second waveguide of the plurality of waveguides, and is substantially the same width as a waveguide opening of the second waveguide;
a first coupling unit including a coupler aligned with the top wall of the first waveguide in the first direction and misaligned with the waveguide opening of the first waveguide in the first direction;
a second coupling unit including a coupler aligned with the top wall of the first waveguide in the first waveguide and misaligned with the waveguide opening of the first waveguide in the first direction, wherein the top wall of the first waveguide is disposed between the first and second coupling units and the first and second coupling units define a distance therebetween shorter than the length of the second waveguide;
a first shield unit disposed between the first coupling unit and the waveguide opening of the second waveguide and coupled between the transmitter and a top surface of the bottom wall of the first waveguide, wherein the first coupling unit is disposed between the waveguide opening of the first waveguide and the first shield unit; and
a second shield unit disposed between the second coupling unit and the waveguide opening of the second waveguide and coupled between the receiver and the top surface of the bottom wall of the first waveguide, wherein the second coupling unit is disposed between the waveguide opening of the first waveguide and the second shield unit,
wherein the waveguide unit is configured to convey electromagnetic radiations along the plurality of waveguides and to transmit frequencies outside of a visible spectrum,
wherein the plurality of waveguides are stacked along a same center line in a direction transverse to a direction of a length of the package substrate to narrow an area occupied by the waveguide unit,
wherein the plurality of waveguides have increasing widths in a direction from a top of the waveguide unit to a bottom of the waveguide unit, and
wherein each of the plurality of waveguides is a dielectric waveguide having a dielectric constant that is larger than a dielectric constant of the plurality of first layers and a dielectric constant of the plurality of second layers.

2. The integrated chip of claim 1, wherein:
the first coupling unit is configured to couple a first electrical signal generated by the transceiver unit to the waveguide unit as an electromagnetic radiation; and
the second coupling unit is configured to couple the electromagnetic radiation from the waveguide unit as a second electrical signal to the transceiver unit.

3. The integrated chip of claim 1, wherein the first shield unit is configured to minimize crosstalk between the plurality of waveguides, the first shield unit coupling the waveguide unit to a ground.

4. The integrated chip of claim 1, wherein each of the first and second coupling units are disposed between the waveguide unit and a respective one of the first and second shield units.

5. The integrated chip of claim 1, further comprising an interposer disposed between the package substrate and the transceiver unit and having a plurality of interconnects.

6. The integrated chip of claim 1, wherein at least one of the plurality of waveguides includes a conductive material.

7. The integrated chip of claim 1, wherein a cross-sectional shape of each waveguide is the same.

8. The integrated chip of claim 1, wherein a width of each waveguide is about 5 to about 15 times a height thereof.

9. The integrated chip of claim 1, wherein the dielectric waveguide comprises silicon nitride or silicon carbide.

10. The integrated chip of claim 1, wherein the dielectric waveguide comprises fluorine-doped silicon dioxide, a carbon-doped silicon dioxide, or a porous silicon dioxide.

11. The integrated chip of claim 1, wherein the transmitter is configured to generate a first electrical signal, the integrated chip further comprising:
  a first interposer, wherein the first coupling unit is configured to receive the first electrical signal through the first interposer and to couple the first electrical signal to the waveguide unit as a first electromagnetic radiation.

12. The integrated chip of claim 11, wherein the first interposer includes a metal line that extends in the first direction and a via that extends in the second direction.

13. The integrated chip of claim 11, wherein the package substrate further includes a first interconnect, the integrated chip further comprising a bump having a substantially rounded cross section and interconnecting the first interposer and the first interconnect.

14. The integrated circuit of claim 11, wherein the transceiver unit further includes a second transmitter configured to generate a second electrical signal, the integrated chip further comprising:
  a second interposer;
  a second coupler configured to receive the second electrical signal through the second interposer and to couple the second electrical signal to the waveguide unit as a second electromagnetic radiation; and
  a shield between the second coupler and a waveguide opening of a third waveguide, connecting the waveguide unit to a ground, and including a plurality of metal lines that extend in the first direction and a plurality of vias that extend in the second direction.

15. The integrated chip of claim 1, wherein:
  the coupler of the first coupling unit is configured to couple an electrical signal between the transceiver unit and the first waveguide,
  the coupler of the first coupling unit is horizontally closer to a side of the top wall of the first waveguide than a vertical projection of a corresponding side of the bottom wall of the first waveguide,
  a shield of the first shield unit is configured to minimize crosstalk between the first and second waveguides, includes a metal line and a via, and coupled between the bottom wall of the first waveguide and electrical ground, and
  the coupler of the first coupling unit is between the top wall of the first waveguide and the shield of the first shield unit.

16. The integrated chip of claim 1, wherein the first coupler of the first coupling unit is in the same layer of the package substrate as the top wall of first waveguide and is in a different layer of the package substrate than the sidewall of the first waveguide.

17. The integrated circuit of claim 1, wherein the coupler of the first coupling unit includes a transducer.

18. The integrated circuit of claim 1, wherein the coupler of the first coupling unit includes an antenna.

19. An integrated chip comprising:
  a package substrate;
  a transceiver unit disposed above the package substrate and including a transmitter and a receiver; and
  a waveguide unit formed in the package substrate and including a plurality of waveguides having a length extending in a first direction, arranged along a second direction transverse to the first direction, and including top and bottom walls, wherein the top and bottom walls are of a different material than the first and second layers, wherein the bottom wall of a first waveguide of the plurality of waveguides has a wider width than a waveguide opening of the first waveguide, serves as the top wall of a second waveguide of the plurality of waveguides, and is substantially the same width as a waveguide opening of the second waveguide;
  a first coupling unit including a coupler aligned with the top wall of the first waveguide in the first direction and misaligned with the waveguide opening of the first waveguide in the first direction;
  a second coupling unit including a coupler aligned with the top wall of the first waveguide in the first waveguide and misaligned with the waveguide opening of the first waveguide in the first direction, wherein the top wall of the first waveguide is disposed between the first and second coupling units and the first and second coupling units define a distance therebetween shorter than the length of the second waveguide;
  a first shield unit disposed between the first coupling unit and the waveguide opening of the second waveguide and coupled between the transmitter and a top surface of the bottom wall of the first waveguide, wherein the first coupling unit is disposed between the waveguide opening of the first waveguide and the first shield unit; and
  a second shield unit disposed between the second coupling unit and the waveguide opening of the second waveguide and coupled between the receiver and the top surface of the bottom wall of the first waveguide, wherein the second coupling unit is disposed between the waveguide opening of the first waveguide and the second shield unit,
  wherein the waveguide unit is configured to convey electromagnetic radiations along the plurality of waveguides and to transmit frequencies outside of a visible spectrum,
  wherein the plurality of waveguides are stacked along a same center line in a direction transverse to a direction of a length of the package substrate to narrow an area occupied by the waveguide unit,
  wherein the plurality of waveguides have increasing widths in a direction from a top of the waveguide unit to a bottom of the waveguide unit, and
  wherein each of the plurality of waveguides is a dielectric waveguide having a dielectric constant that is larger than a dielectric constant of the package substrate.

20. An integrated chip comprising:
  a package substrate including a plurality of first layers and a plurality of second layers, each second layer being disposed between a respective adjacent pair of the first layers;
  a transceiver unit disposed above the package substrate and including a transmitter and a receiver;
  a waveguide unit including a plurality of waveguides having a length extending in a first direction, arranged along a second direction transverse to the first direction, and including top and bottom walls formed in the first layers of the package substrate and sidewalls formed in the second layers of the package substrate, wherein the top and bottom walls are of a different material than the first and second layers, and wherein the bottom wall of a first waveguide of the plurality of waveguides has a wider width than a waveguide opening of the first waveguide, serves as the top wall of a second waveguide of the plurality of waveguides, and is substantially the same width as a waveguide opening of the second waveguide;

a first coupling unit including a coupler aligned with the top wall of the first waveguide in the first direction and misaligned with the waveguide opening of the first waveguide in the first direction;

a second coupling unit including a coupler aligned with the top wall of the first waveguide in the first waveguide and misaligned with the waveguide opening of the first waveguide in the first direction, wherein the top wall of the first waveguide is disposed between the first and second coupling units and the first and second coupling units define a distance therebetween shorter than the length of the second waveguide;

a first shield unit disposed between the first coupling unit and the waveguide opening of the second waveguide and coupled between the transmitter and a top surface of the bottom wall of the first waveguide, wherein the first coupling unit is disposed between the waveguide opening of the first waveguide and the first shield unit; and a second shield unit disposed between the second coupling unit and the waveguide opening of the second waveguide and coupled between the receiver and the top surface of the bottom wall of the first waveguide, wherein the second coupling unit is disposed between the waveguide opening of the first waveguide and the second shield unit, wherein the waveguide unit is configured to convey electromagnetic radiations along the plurality of waveguides and to transmit frequencies outside of a visible spectrum, wherein the plurality of waveguides are stacked along a same center line in a direction transverse to a direction of a length of the package substrate to narrow an area occupied by the waveguide unit, wherein the plurality of waveguides have increasing widths in a direction from a top of the waveguide unit to a bottom of the waveguide unit, and wherein each of the plurality of waveguides is a dielectric waveguide having a dielectric constant that is larger than a dielectric constant of the plurality of first layers and a dielectric constant of the plurality of second layers.

\* \* \* \* \*